US012776784B2

(12) United States Patent
Mehta et al.

(10) Patent No.: US 12,776,784 B2
(45) Date of Patent: Oct. 27, 2026

(54) SYSTEM AND METHOD FOR NYQUIST RATE DATA CONVERSION USING DYNAMIC ELEMENT MATCHING (DEM) SYSTEMS WITH A LOOP-FILTER

(71) Applicant: Alphacore, Inc., Tempe, AZ (US)

(72) Inventors: Shantanu Mehta, Bangalore (IN); Phaneendra Bikkina, Tempe, AZ (US); Esko Mikkola, Mesa, AZ (US)

(73) Assignee: ALPHACORE, INC., Tempe, AZ (US)

( * ) Notice: Subject to any disclaimer, the term of this patent is extended or adjusted under 35 U.S.C. 154(b) by 4 days.

(21) Appl. No.: 19/413,812

(22) Filed: Dec. 9, 2025

(65) Prior Publication Data

US 2026/0261266 A1 Sep. 3, 2026

Related U.S. Application Data

(60) Provisional application No. 63/765,078, filed on Feb. 28, 2025.

(51) Int. Cl.
*H03M 1/66* (2006.01)
*H03M 1/76* (2006.01)

(52) U.S. Cl.
CPC ............. *H03M 1/662* (2013.01); *H03M 1/76* (2013.01)

(58) Field of Classification Search
CPC ...... H03M 1/1245; H03M 1/662; H03M 1/76; H03M 1/66; H03M 3/394
USPC ......................... 341/144, 155, 143, 120, 118
See application file for complete search history.

(56) References Cited

U.S. PATENT DOCUMENTS

| | | | | |
|---|---|---|---|---|
| 6,864,818 B1 * | 3/2005 | Hezar | H03M 3/396 341/143 |
| 2006/0007027 A1 * | 1/2006 | Ishizuka | H03M 1/067 341/50 |
| 2007/0080843 A1 * | 4/2007 | Lee | H03M 3/462 341/155 |
| 2007/0189430 A1 * | 8/2007 | Chang | H03L 7/093 375/376 |
| 2019/0207616 A1 * | 7/2019 | Chen | H03M 1/1014 |

OTHER PUBLICATIONS

Mehta, Shantanu et al., "Comparison of High-Order Programmable Mismatch Shaping Bandpass DEM Implementations Applicable to Nyquist-rate D/A Converters", IEEE Open Journal of Circuits and Systems; vol. 2; Nov. 2, 2021; https://ieeexplore.ieee.org/document/9598861; 13 pages.

(Continued)

*Primary Examiner* — Peguy Jean Pierre
(74) *Attorney, Agent, or Firm* — LOZA & LOZA, LLP

(57) ABSTRACT

The present invention relates to a dynamic element matching (DEM) system for a Nyquist-rate digital-to-analog converter (DAC). As example of a system includes multiple digital encoders, each digital encoder including a loop-filter system, where the loop-filter system includes delay elements, adders, and at least one multiplier configured to implement pipelining and a feedback loop that couples an output of a quantizer to an input of the filter system and couples an output of the filter system to an input of the quantizer. Such a DEM system facilitates dynamic error correction and mismatch compensation in the DAC, improving the overall performance by reducing distortion and enhancing signal fidelity.

23 Claims, 26 Drawing Sheets

Vector feedback DEM hardware realization for a 2-bit DAC

(56) References Cited

OTHER PUBLICATIONS

Mehta, Shantanu et al., "A Higher-Order Programmable Amplitude and Timing Error Shaping Bandpass DEM for Nyquist-Rate D/A Converters", 2021 IEEE International Symposium on Circuits and Systems (ISCAS); May 22-28, 2021; https://ieeexplore.ieee.org/document/9401729; 5 pages.

Sanyal, Arindam et al., "Dynamic Element Matching With Signal-Independent Element Transition Rates for Multibit Δσ Modulators", IEEE Transactions on Circuits and Systems I: Regular Paper; vol. 62, Issue 5; May 2015; https://ieeexplore.ieee.org/document/7080929; 10 pages.

Shaw, Arnab K et al., "Pipelined Recursive Digital Filters: A General Look-Ahead Scheme and Optimal Approximation", IEEE Transactions on Circuits and Systems II: Analog and Digital Signal Processing; vol. 46, Issue 11; Nov. 30, 1999; https://ieeexplore.ieee.org/document/803481; 6 pages.

Taherzadeh-Sani, Mohammad et al., "Analysis of Dynamic Element Matching (DEM) in Pipelined ADCs", 2006 IEEE International Symposium on Circuits and Systems, May 21-24, 2006; https://ieeexplore.ieee.org/document/1693820; 4 pages.

* cited by examiner

Modified vector feedback DEM

Vector feedback DEM hardware realization for a 2-bit DAC

Tree-structured DEM using a 3-bit DAC example

The general form of a 'switching block'

Timing skew error

Static mismatch error

SYSTEM AND METHOD FOR NYQUIST RATE DATA CONVERSION USING DYNAMIC ELEMENT MATCHING (DEM) SYSTEMS WITH A LOOP-FILTER

CROSS-REFERENCE TO RELATED APPLICATIONS

The present application claims priority to U.S. Provisional Patent Application Ser. No. 63/765,078, filed Feb. 28, 2025, which is incorporated by reference herein.

FIELD OF THE INVENTION

The present application relates to a system, method and computer readable storage medium for performing dynamic element matching (DEM) for data converters and in particular a Nyquist-rate digital-to-analog converter (DAC).

BACKGROUND TO THE INVENTION

In modern wireless communication systems, DACs and analog-to-digital converters (ADCs) have facilitated the replacement of complex analog circuitry with digital technologies. In turn, this has enabled the implementation of software-defined radios (SDRs)—i.e. radio communication system where components that have been traditionally implemented in hardware (e.g. mixers, filters, amplifiers, modulators/demodulators, detectors, etc.) are instead implemented by means of software. When used as part of a radio frequency (RF) system, a DAC converts digital bits into an RF signal. In this conversion process, a DAC is ideally required to cover the signal bands of different radio standards, preferably while maintaining high spectral purity in the presence of in-band interference.

For the wideband applications, the performance of a DAC may be assessed based on one or more of the following metrics: spurious-free-dynamic-range (SFDR), intermodulation-distortion (IMD), and signal-to-noise-and-distortion-ratio (SNDR). Unfortunately, non-ideal circuit behaviour may cause errors in a DAC. These errors have a negative impact on performance, which can be seen in any one of the SFDR, IMD, and SNDR metrics. These errors can be classified as static errors and dynamic errors.

A static error of a measuring instrument is the numerical difference between the true value of a quantity and its value as obtained by measurement. For example, static errors will cause repeated measurement of the same quantity giving different indications. Static errors include random and deterministic errors due to current-source ($CS_{rc}$) cell mismatches. A dynamic error is the difference between the true value of a quantity that is changing with time and the value indicated by the measurement system, if no static error is assumed. Dynamic errors include mismatch-based timing-skew errors, common-duty-cycle errors, and jitter from clock sources. Furthermore, signal-dependent finite output-impedance of the unit $CS_{rc}$ cell degrades the DAC's dynamic performance at high frequencies.

Several solutions have been proposed for Nyquist DACs to mitigate the impact of static errors and to improve the dynamic performance over the Nyquist band. Some foreground or background techniques in involve complex static calibrations using analog and digital circuitry. Dynamic element matching (DEM) using randomization methods translates the distortion tones into white noise resulting in a flat spectrum across the entire band leading to in-band signal-to-noise-ratio (SNR) degradation. A data-weightedaveraging (DWA) scheme is a first-order mismatch shaping DEM, however element selection patterns using DWA introduces idle tones into the in-band portion of the spectrum. In time-interleaved architectures, any mismatch between sub-DACs limits the cancellation of image frequencies; these images fall within the in-band section of the overall DAC assuming full Nyquist operation. The above-mentioned techniques are not as effective in mitigating the DAC errors at high frequencies, therefore, the DAC's SFDR and IMD performance may degrade significantly above $F_s/4$.

A dynamic-mismatch-mapping (DMM) technique combines amplitude and time mapping that reorders the usage pattern of nominally identical components to reduce the dynamic integral non-linearity (INL). However, this technique does not achieve the maximum amplitude or timing mismatch correction since it balances its mapping between the two. Other techniques such as always 'ON' cascoding, digital-random-return-to-zero (DRRZ), and dynamic-element-matching-digital-return-to-zero (DEMDRZ) are may reduce the impact of the static errors and switching glitches. These techniques help to mitigate against the impact of static errors, however, it is not explicitly mentioned how these techniques reduce the impact of timing errors such as mismatch-based timing-skew errors and the common-duty-cycle errors. Moreover, these techniques are a combination of analog circuitry and a digital logic.

Other techniques involve a hybrid DAC that uses a pulsed error direct position determination (DPD) to mitigate amplitude and timing errors of the DAC. First, the most significant bit (MSB)-DAC errors are measured, and then equal but opposite errors are added to the output using a least significant bit (LSB)-DAC that operates at a much higher speed than the MSB-DAC section. However, this requires an LSB-DAC to generate sub-ps pulses to correct timing errors. Instead, an equivalent area pulse, that is longer in time and lower in amplitude than the sub-ps timing correction pulse, is used. However, widening the pulse relaxes the timing constraints at the expense of amplitude precision, leading to a trade-off between the LSB-DAC resolution and speed.

In another technique, a mismatch-noise-cancellation (MNC) technique is used to reduce the impact of dynamic errors and combines with DEM logic to reduce the static mismatch errors for improving DACs dynamic performance. However, the MNC technique cannot utilize the top 12% of the first Nyquist-band due to the aliasing from the decimation filter's transition band, which reduces the accuracy of this technique in this band. Furthermore, the design necessitates a voltage-controlled-oscillator based ADC, an error correction DAC, a decimation filter, a digital error estimator, and DEM logic, which significantly increase the complexity of the design and silicon area.

On the other hand, noise-shaping sigma-delta DACs are an attractive choice for numerous applications due to their ability to tolerate high levels of static mismatch error. The combination of an oversampled noise shaped signal and DEM logic results in the mismatch error being pushed out of band. However, the inherent requirement for the signal to be oversampled limits their usage in high-speed wideband applications. Furthermore, to produce the same amount of output power as that of the Nyquist DAC, the $CS_{rc}$ cell in the sigma-delta DAC would steer a large amount of current. This will cause an increase in the total quantization noise power and higher sensitivity to the clock jitter.

SUMMARY

The present application is directed towards systems and methods for Nyquist-rate data conversion using a DEM system. In an example, a DEM system for a Nyquist-rate digital-to-analog converter (DAC) includes multiple digital encoders, each digital encoder including a loop-filter system, where the loop-filter system includes delay elements, adders, and at least one multiplier configured to implement pipelining and a feedback loop that couples an output of a quantizer to an input of the filter system and couples an output of the filter system to an input of the quantizer.

In an example, the loop-filter system further includes at least one multiplexer that is configured with pre-computed values to replace a multiplication operation, and that is controlled in response to the output from the quantizer.

In an example, the loop-filter system further includes three multiplexers that are configured with pre-computed values to replace multiplication operations, and that are controlled in response to the output from the quantizer.

In an example, the loop-filter system further includes three multiplexers configured with pre-computed values to replace multiplication operations, is applied to the at least one multiplier, and further including a bank of multiplexers configured to receive the output of the quantizer, a first multiplexer configured to receive 0, $b_0$, and $-b_0$ as inputs, a second multiplexer configured to receive 0, $b_1$, and $-b_1$ as inputs, and a third multiplexer configured to receive 0, +1, and −1 as inputs.

In an example, $a_0$ is applied to a first multiplier, $b_0$ is applied to a second multiplier, and $b_1$ is applied to a third multiplier.

In an example, $a_0$ is applied to the at least one multiplier, wherein $b_0$ is applied to a first multiplexer, and $b_1$ is applied to a second multiplexer, and 0, 1, +1 is applied to a third multiplexer.

In an example, $a_0$ is applied to the at least one multiplier, and further including a bank of multiplexers configured to receive the output of the quantizer, a first multiplexer configured to receive 0, $b_0$, and $-b_0$ as inputs, a second multiplexer configured to receive 0, $b_1$, and $-b_1$ as inputs, and a third multiplexer configured to receive 0, +1, and −1 as inputs.

In an example, the DEM system is a tree-structured DEM (TS DEM) that includes a tree structure of switching blocks, wherein each switching block includes an encoder and a quantizer.

In an example, the loop-filter system is configured for dynamic adjustment of its order.

In an example, the DEM system is configured to accept a full-scale signal as the input.

In an example, the loop-filter system includes a mismatch loop filter configured to shape mismatch errors introduced by the DAC.

In an example, the loop-filter system includes a timing loop filter configured to shape timing errors introduced by the DAC.

In an example, wherein the loop-filter system includes a mismatch loop filter configured to shape mismatch errors introduced by the DAC and a timing loop filter configured to shape timing errors introduced by the DAC.

In an example, the loop-filter system includes one of a notch filter and a band-pass filter.

In an example, the loop-filter system includes one of an infinite impulse response (IIR) filter and a finite impulse response (FIR) filter.

In an example, the loop-filter system is implemented through multiple digital biquad filters.

In an example, the DEM system is a vector-feedback DEM (VF DEM) system.

In another example, a tree-structured dynamic element matching (TS DEM) system for a Nyquist-rate DAC includes multiple TS DEM switching blocks, each TS DEM switching block including digital encoders, each digital encoder including, a quantizer, a loop-filter system, where the loop-filter system includes a mismatch loop filter configured to shape mismatch errors introduced by the DAC, where the loop-filter system includes delay elements, adders, and at least one multiplier configured to implement pipelining, and a feedback loop that couples an output of the quantizer to an input of the loop-filter system and couples an output of the loop-filter system to an input of the quantizer.

In an example, the loop-filter system further includes at least one multiplexer that is configured with pre-computed values to replace a multiplication operation, and that is controlled in response to the output from the quantizer.

An example of a method for performing dynamic element matching in a digital-to-analog conversion system is disclosed. The method includes transmitting an output of a quantizer to a loop-filter system, shaping conversion errors using the loop-filter system, and feeding an output of the loop-filter system back into the quantizer to complete a conversion cycle, wherein shaping conversion errors using the loop-filter system includes implementing pipelining.

In an example, the loop-filter system includes delay elements, adders, and at least one multiplier.

In an example, the loop-filter system further includes at least one multiplexer that is configured with pre-computed values to implement a multiplication operation, and that is controlled in response to the output from the quantizer.

As compared to previously published amplitude and timing error alleviating techniques that use combined analog and digital circuitry, the proposed solution is fully digital and reconfigurable. Moreover, the present disclosure is directed towards overcoming the problems associated with these systems using a programmable loop-filter to shape the DAC errors in a band of interest.

BRIEF DESCRIPTION OF THE DRAWINGS

The invention will be more clearly understood from the following description of an embodiment thereof, given by way of example only, with reference to the accompanying drawings.

FIG. 12A shows spectrum plots for $F_s/8$ centre frequency for common-duty-cycle error for a 12-bit Nyquist DAC for configurations where the DEM is off and configurations where is on.

FIG. 12B shows spectrum plots for $F_s/8$ centre frequency for timing-skew error for a 12-bit Nyquist DAC for configurations where the DEM is off and configurations where is on.

FIG. 12C shows spectrum plots for $F_s/8$ centre frequency for static mismatch error for a 12-bit Nyquist DAC for configurations where the DEM is off and configurations where is on.

DETAILED DESCRIPTION

Figure 1A:
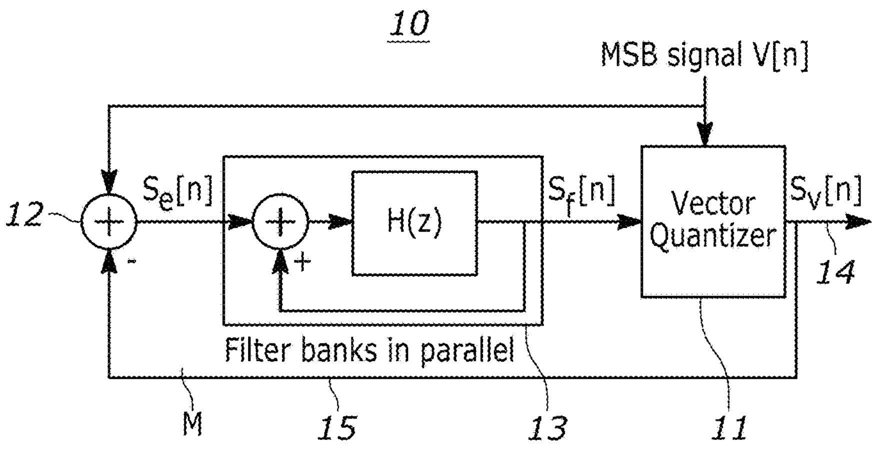
FIG. 1A is a block diagram of a modified a VF-DEM design.

In an example, the present disclosure is directed towards a dynamic element matching, DEM, system for a Nyquist-rate digital to analog converter, DAC, comprising a loop-filter wherein the loop-filter includes: a filter configured to shape errors; and a loop, wherein the loop is a feedback loop for providing the output of a quantizer of the DEM to the input of the filter and for providing the output of the filter to the input of the quantizer.

In a particular embodiment, the invention provides a wideband, higher-order programmable bandpass DEM technique that reduces the impact of errors, such as static mismatch errors, within the most significant bit (MSB) segment of the Nyquist DAC. This technique offers flexibility by allowing the order of the bandpass DEM filter to be selected (e.g., 2, 4, 6), enabling the shaping of errors over a desired bandwidth that can be tailored to the specific requirements of a given application.

The proposed system enables error shaping for any selected center frequency within the first Nyquist band, with the capability to shape errors over a narrow or wide bandwidth up to 20% of the sampling frequency ($F_s$), depending on the selected order of the DEM filter. The loop-filter is efficiently implemented in vector-feedback (VF) and tree-structured (TS) DEM configurations, which are applicable to Nyquist DACs and scalable for use in submicron CMOS/FINFET technologies. Additionally, the placement of poles and zeros is flexible, enabling the tuning of the frequency response of the loop-filter.

In a practical demonstration for a 12-bit Nyquist DAC (with 5T-7B segmentation), the system achieved an in-band SFDR of ≥88 dB and in-band Third-Order Intermodulation Distortion (IMD3) of ≥80 dB, regardless of the center frequency chosen for the 6th-order bandpass DEM. These results were validated using a 0.5% Gaussian distributed mismatch error on the DAC elements, with performance evaluated over a 20% bandwidth of $F_s$. The demonstration was performed using the System-Generator for DSP™ (SysGen) tool targeting a Xilinx Zynq UltraScale+ high-speed FPGA device.

The tunable filter order allows for shaping mismatch errors across narrow or wide frequency bands, providing superior dynamic performance compared to traditional mismatch scrambling DEM systems evaluated within the same performance bandwidth.

The proposed DEM system is optimized for high-speed applications, incorporating hardware-efficient implementations such as pipelining and the use of pre-computation-based multiplexers in place of multipliers.

Additionally, the loop-filter can be extended to mitigate the effects of both amplitude and timing errors in the MSB section of the segmented Nyquist DAC. This adaptable solution supports various DEM orders, center frequencies, and operational bandwidths, making it suitable for a range of high-performance DAC applications.

As shown for a 12-bit Nyquist DAC (5T-7B segmentation), the lowest in-band SFDR is ≥83 dB and in-band IMD3 is ≥82.7 dB for any choice of centre frequency of the $2^{nd}$ order amplitude and timing error shaping bandpass DEM. To demonstrate these results, a 0.5% Gaussian distributed mismatch error, a 0.3% Gaussian distributed timing-skew error, and a 0.1% absolute common-duty-cycle error on the DAC elements was used. The performance was evaluated over 5% of $F_s$ around the centre frequencies. The results were verified using MATLAB/Simulink behavioural simulations.

The proposed system is preferably fully digital and scalable to any submicron CMOS/FINFET technology. The fully digital DEM technique can be implemented at sampling frequencies in the gigahertz range using pipelining, parallelization and unrolling techniques.

In an example, the filter is a programmable filter whereby the order of the filter can be changed. The filter is a notch filter or a band-pass filter. More preferably, the filter is an infinite impulse response, IIR, filter.

In an example, the filter is implemented using a plurality of digital biquad filters. Optionally, the digital biquad filters are arranged in parallel and/or the filter is implemented as a direct-form II implementation.

In an example, the DEM is a vector-feedback DEM or a tree-structured DEM.

In one configuration, the loop-filter is configured to shape mismatch errors. In another configuration, the loop-filter is configured to shape timing errors. Preferably, the system comprises a first loop-filter configured to shape mismatch errors, and a second loop-filter is configured to shape timing errors.

The present disclosure is also directed towards a method of performing DEM for digital to analog conversion, the method including: providing the output of a quantizer of the DEM to a filter; shaping errors with the filter; and providing the output of the filter to the input of the quantizer.

In an example, the method includes configuring the filter, wherein configuring comprises selecting the order of the filter.

The filter may be configured to shape mismatch errors. Alternatively, the filter may be configured to shape timing-skew errors. The vector-quantizer (VQ) may be configured to control ON transitions to eliminate common-duty-cycle errors. Preferably, the method comprises providing the output of a quantization stage of the DEM to a first filter configured to shape mismatch errors and a second filter is configured to shape timing errors; and providing the output of the filters to the input of the quantization stage of the DEM.

The present disclosure is also directed towards a computer storage medium storing instructions for performing dynamic element matching for digital to analog conversion which, when executed by a processing unit, is configured to cause the processing unit to perform the method described above.

It is known in the art to provide a system comprising a mismatch-scrambling DEM. The system is configured to scramble the mismatch error of the MSB segment of a DAC. In particular, the system comprises one or more DEMs, configured to translate distortion tones into the white noise. This can be done by any suitable means e.g. by randomization or data weighted average (DWA). As a result of being translated into white noise, the noise flattens over the Nyquist band. This technique is particularly well suited for wide-band Nyquist DACs. Preferably, the one or more DEMs translate the mismatch error of the MSB segment of a Nyquist DAC to white noise over the first Nyquist band. However, an increase in mismatch errors increases the noise floor of the mismatch scrambling DEM systems. At a certain point, the flat spectrum of white noise cannot be shaped out across the Nyquist band leading to SNDR and SFDR degradation.

The present application pertains to overcoming issues associated with mismatch errors in digital-to-analog conversion by employing mismatch-shaping DEM techniques, including, but not limited to, vector-feedback (VF) DEMs or tree-structured (TS) DEM systems. Specifically, mismatch errors in the DAC elements are shaped within a desired frequency band through the use of mismatch-shaping DEM systems. The utilization of mismatch-shaping DEM systems results in improved performance metrics, such as Signal-to-Noise and Distortion Ratio (SNDR) and Spurious-Free Dynamic Range (SFDR), as compared to mismatch scrambling DEM systems.

The application of mismatch-shaping techniques further provides flexibility in the resulting system design, as these systems allow for the implementation of mismatch-shaping filters of any order. This flexibility enables the shaping of mismatch errors over either narrow or wide frequency bands, a capability not available with mismatch scrambling DEM systems.

While VF and TS DEM systems are known in the prior art, the present disclosure improves upon these systems by integrating a loop-filter, which is preferably of higher order. The inclusion of the loop-filter, specifically employing the efficient realization methods even for a high-speed application as described herein, within the DEM structures represents a novel aspect of the present invention. Furthermore, the integration of the Nyquist DAC filter design with these enhanced DEM systems to offer a tunable bandpass DEM solution is also a novel approach.

This document is organized as follows: Section 1 describes the operation and hardware implementation of VF and TS DEM systems; Section 2 details the design methodology and efficient implementation of the higher-order loop-filter within these DEM systems; and Section 3 presents the results of the proposed DEM system. For illustrative purposes, the proposed DEM system was implemented using a XILINX UltraScale+ FPGA device. It should be understood that the described implementation is provided by way of example, and that other implementations consistent with the present invention, as defined by the appended claims, are contemplated.

DEMs

Vector-Feedback DEM

VF-DEM techniques are known in the field.

According to the present disclosure, the digital encoder block of a DAC is shown in FIG. 1A. The encoder 10 includes a vector-quantizer (VQ) 11, a subtractor 12 and a bank of mismatch-shaping filters 13 in the feedback path. For an N-bit and M-level (where $M=2^N$) DAC, the feed-back loop 15 contains M vector signals in parallel. The output of the VQ $S_v[n]$ 14 is a vector containing a 1-bit signal, which gets subtracted from the input signal V[n] i.e. the MSB signal of the segmented Nyquist DAC and the resulting error $S_e[n]$ is then passed through a filter. The filtered output acts as an input to the VQ. The VQ selects the appropriate number of DAC elements from its input $S_f[n]$ with priority given to the largest value of the element based on the MSB segment value.

Figure 1B:
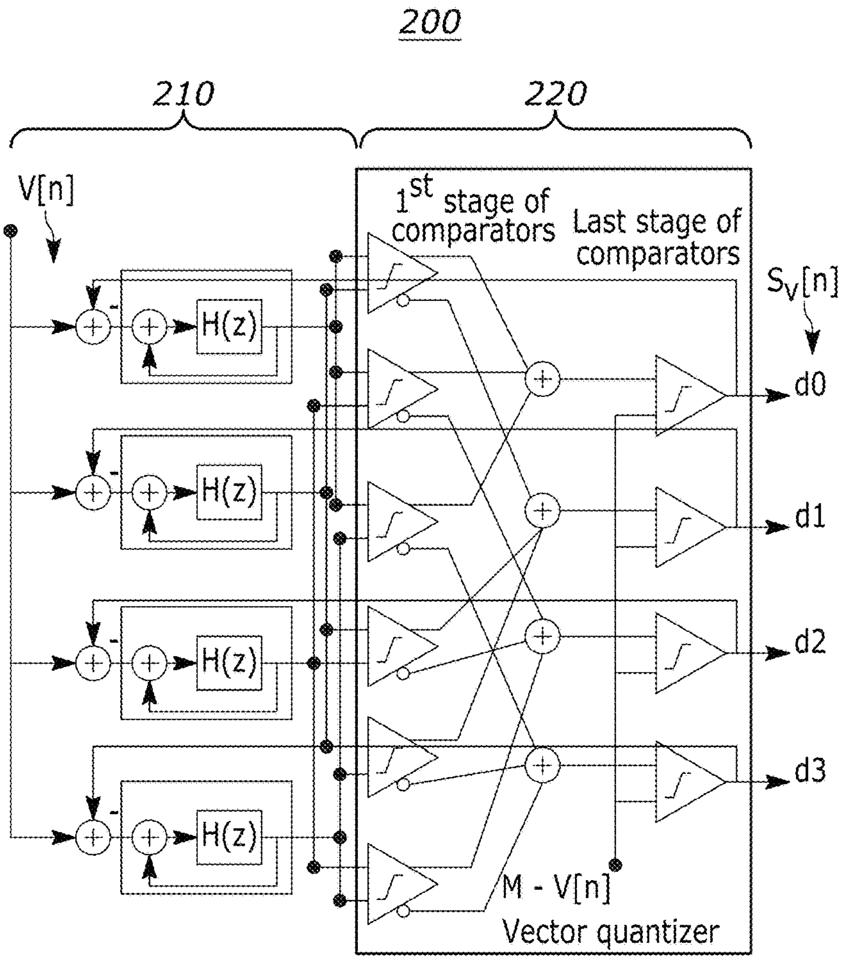
FIG. 1B is a block diagram of an exemplary 2-bit DAC.

At least one contribution of the present disclosure is the realization that a VF DEM can be used in a DAC. An example of such a DAC 200 is shown in FIG. 1B. Although this example illustrates a 2-bit (i.e. 4-level) DAC 200, those skilled in art will recognize that higher level N-bit and M-level (where where $M=2^N$) DAC can be implemented based on the principles outlined below. The design includes a first bank 210 of VF-DEMs, where each DEM includes subtractors, and a filter bank. For an M-level DAC, the first bank includes M DEMs arranged in parallel, e.g., for the 4-level DAC 200 shown in FIG. 1B, the first bank 210 includes 4 DEM systems.

The VQ 220 in FIG. 1B is implemented using a bank of six comparators and four adders in the first stage, and four comparators in the final stage. In this example, the first stage of comparator banks ranks the four filter banks based on their output value. The highest rank is given to the filter bank with the larger output value and the second highest rank will be given to the second largest output value of the filter bank and so forth. The output of comparator banks in the first stage is then added using four 2-bit adders. The final stage of comparator bank sets the appropriate number of comparators output to '1' based on the MSB segment value with priority given to the largest output value of the adder.

For an N-bit and M-level DAC, the total number of comparators required are $(M^2+M)/2$. The number of comparators required in the first stage are $(M^2-M)/2$, and the remaining number of comparators in the final stage are M. The M n-bit adders are required to add outputs of the first stage comparators, where $n=\log_2(M)$.

Tree-Structured (TS) DEM

Figure 2A:
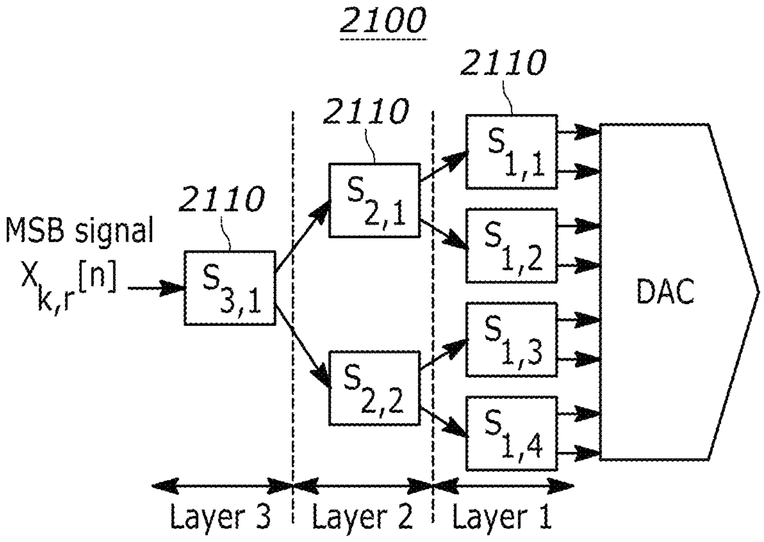
FIG. 2A is a block diagram of an exemplary TS DEM using a 3-bit DAC example.

An example of a three-bit TS DEM 2100 implementation is shown in FIG. 2A. This example includes three layers of digital devices called "switching blocks" 2110, each of which is labelled $S_{k,r}$ where k denotes the layer number and r denotes the position of the switching block in the layer.

Figure 2B:
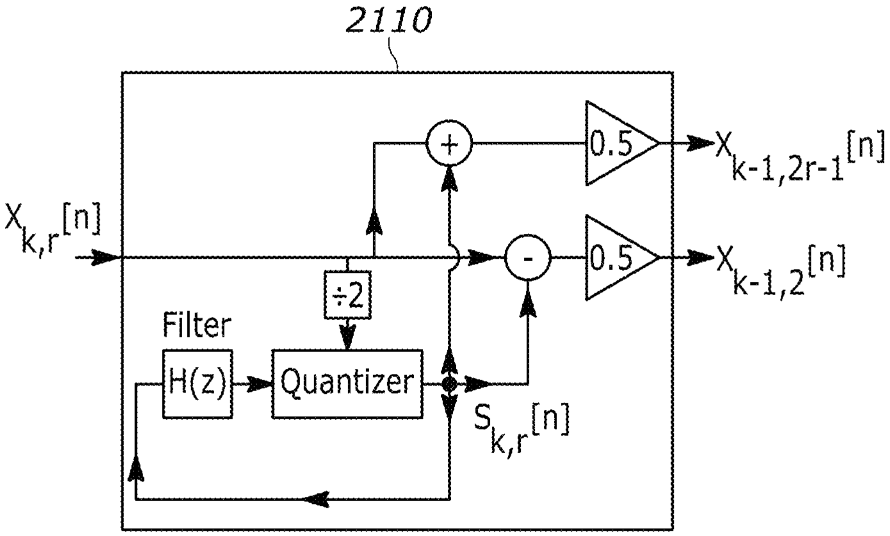
FIG. 2B is a block diagram of an exemplary switching block.

The general form of the switching block 2110 is shown in FIG. 2B. The switching block divides its input $x_{k,r}[n]$ amongst its two outputs named $x_{k-1,2r-1}[n]$ and $x_{k-1,2r}[n]$ as shown in the figure. Each switching block 2110 internally generates a switching sequence $S_{k,r}[n]$ based on the input and the value from the feedback filter.

Additionally, each of the switching blocks must obey the number conservation rule where the sum of the outputs must be equal to the inputs and each output must not violate the range (0 to $2^{k-1}$). Furthermore, when the input of the switching block $x_{k,r}[n]$ is even then $s_{k,r}[n]$ is even and if it is odd then $S_{k,r}[n]$ is odd. If the switching block generates a $L^{th}$-order shaped switching sequence $s_{k,r}[n]$, which is uncorrelated from the $s_{k,r}[n]$ of the other switching blocks, then the DACs mismatch error will be $L^{th}$-order shaped sequence.

The hardware realization of the switching block 2110 utilizes an EX-OR gate, adders, multipliers, a mux logic and delay elements in the filter bank.

In the following section, an example of the filter response design technique and its efficient hardware realization for higher-orders using a parallel bi-quad structure for VF and TS DEM is discussed.

DEM Filter Design

This section discusses a frequency-response design methodology for a loop-filter. This section also discusses an example of a notch filter using a parallel bi-quad structure.

Frequency-Response of Programmable Loop Filter

In an example, a mismatch shaping loop-filter is employed within the VF and TS DEM configurations. This mismatch shaping loop-filter is implemented using a notch filter, and in an example, the notch filter is programmable. In an example, the notch filter is a higher-order programmable Infinite Impulse Response (IIR) filter. For example, a $6^{th}$ order IIR notch filter has been found to be particularly suitable for this application.

The coefficient values for the IIR notch loop-filter used in the VF and TS DEM structures can be derived from equation (1) for different orders and varying frequency locations. Specifically, equation (1) describes the frequency response of an $L^{th}$ order notch filter, which can be achieved by optimally placing a combination of poles and zeros within the Z-plane. The poles must be placed in a manner that ensures the stability of the filter. The numerator and denominator in equation (1) represent the complex-conjugate zeros and complex-conjugate poles, respectively, where the radius of the poles is denoted as r.

$$H(z)=\left[\frac{(z-e^{j\theta})(z-e^{-j\theta})}{(z-re^{j\theta})(z-re^{-j\theta})}\right]^{L} \quad (1)$$

Figure 3:
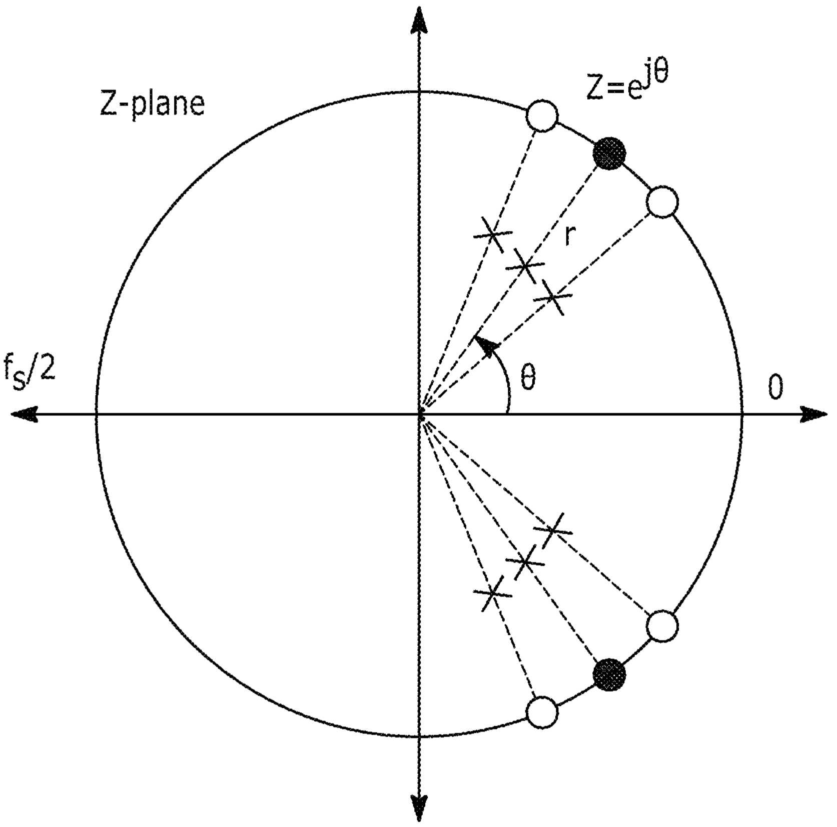
FIG. 3 shows $6^{th}$ order IIR notch filter complex conjugate poles and zeros in the z-plane for $F_s/8$ center-frequency.

For illustrative purposes, FIG. 3 depicts the placement of the complex-conjugate zeros and poles for the sixth-order IIR notch loop-filter employed in the DEM structures, specifically at an $F_s/8$ center frequency. In this configuration, the complex-conjugate zeros are positioned at an angle θ on the unit circle to determine the center frequency of the loop filter. Additionally, two other complex-conjugate zeros, placed symmetrically around the angle θ, create notches to the left and right of the center frequency. The placement of the complex-conjugate poles aligns with the zeros and is situated within the unit circle, using a radius r<1, which ensures the filter's stability. The location of the poles within the unit circle determines the in-band attenuation and the out-of-band gain of the DEM response.

Figure 4A:
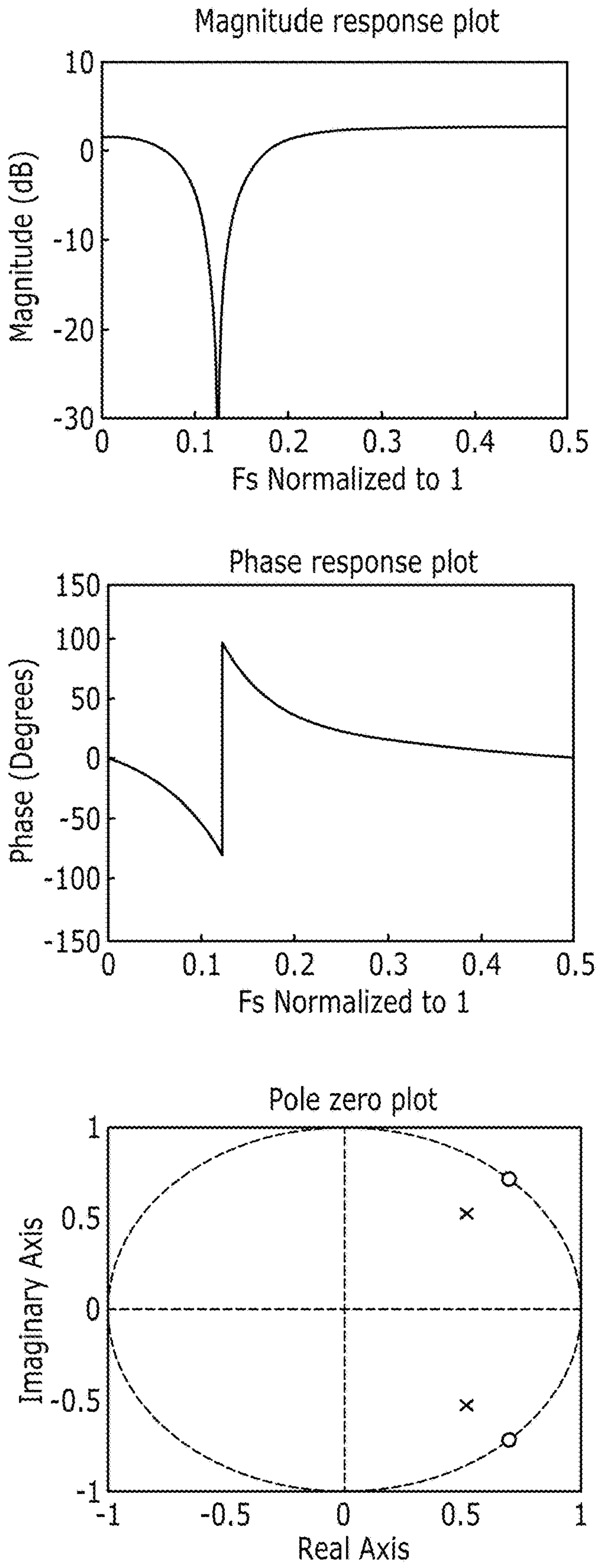
FIG. 4A shows magnitude, phase and pole-zero plots for the $2^{nd}$ order IIR notch filter at centre frequency $F_s/8$.
Figure 4B:
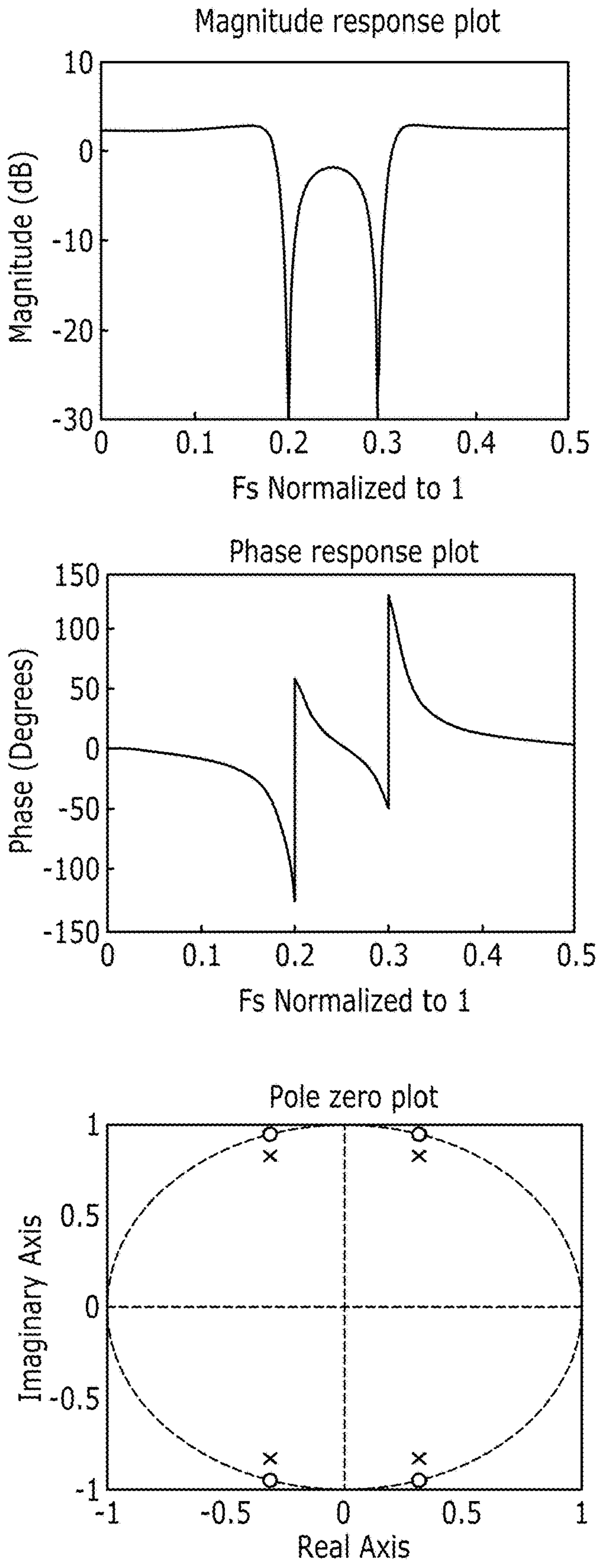
FIG. 4B shows magnitude, phase and pole-zero plots for the $4^{th}$ order IIR notch filter at centre frequency $F_s/4$.
Figure 4C:
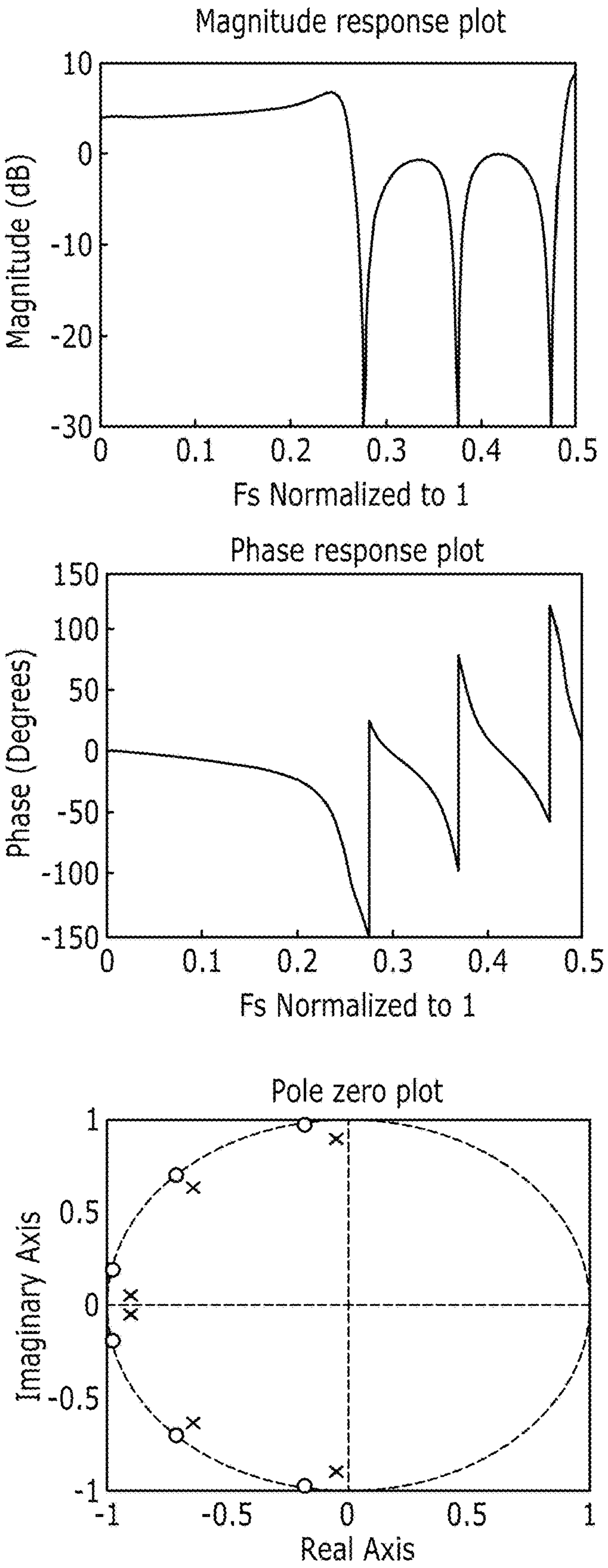
FIG. 4C shows magnitude, phase and pole-zero plots for the $6^{th}$ order IIR notch filter at centre frequency $3F_s/8$.

In one example, the sixth-order filter is implemented using a parallel bi-quad structure, which allows for selectable filter orders of 2, 4, or 6. Benefits of this parallel bi-quad filter structure, as well as its implementation details, will be discussed in the following section. By adjusting the coefficient values, such as by changing the placement of poles and zeros, the shape of the mismatch error can be controlled over either a narrow or wide band for any given center frequency. This is illustrated in FIGS. 4A-4C, where FIG. 4A shows the magnitude, phase, and pole-zero plot for a second-order IIR notch filter at an $F_s/8$ center frequency; FIG. 4B presents the magnitude, phase, and pole-zero plot for a fourth-order IIR notch filter at an $F_s/4$ center frequency; and FIG. 4C displays the magnitude, phase, and pole-zero plot for a sixth-order IIR notch filter at a $3F_s/8$ center frequency.

Efficient Implementation of the Programmable High-Order Loop Filter

A potential issue with utilizing an $L^{th}$ order Infinite IIR filter is that as the order of the filter increases, the complexity of the implementation also increases. In the case of fixed-point implementations, factors such as coefficient quantization, rounding errors, overflow, and stability must be carefully managed. For instance, the numerator and denominator coefficients of a $6^{th}$ order IIR notch filter, implemented using a Direct-Form (DF) structure and designed for a center frequency of $3F_s/8$, are provided in Table 1, with the corresponding frequency response shown in FIG. 4C. The $6^{th}$ order filter, realized in DF structure, has coefficient values ranging from −6 to +8. This range requires larger bit widths for a fixed-point implementation, resulting in increased hardware requirements. Additionally, the use of larger coefficient values for each sample multiplication can lead to data overflow, potentially causing filter instability. Therefore, a $6^{th}$ order filter realization using the DF structure is not an optimal choice when considering stability, high-speed operation, and hardware efficiency. Furthermore, the total number of multipliers required for the DF realization of the coefficients in Table 1 is 12, which increases the digital signal processor (DSP) count.

TABLE 1

$6^{th}$ order Direct Form IIR notch filter coefficients at $3F_s/8$.

| | | | | | | |
|---|---|---|---|---|---|---|
| Numerator coefficients | | | | | | |
| 0 | −1.1632 | −3.4981 | −5.2046 | −4.8682 | −2.8966 | −0.8487 |
| Denominator coefficients | | | | | | |
| 1 | 3.584 | 6.431 | 7.683 | 6.431 | 3.584 | 1 |

In the present disclosure, the $6^{th}$ order IIR filter is decomposed into three second-order-stages (SOS) to provide greater flexibility, ensure stability, and reduce implementation complexity. These smaller stages are then arranged in parallel to form a parallel bi-quad structure. The primary advantage of the bi-quad structure is its reduced sensitivity to quantization effects, as well as the need for fewer bits to represent the coefficients, thereby leading to a reduction in hardware requirements.

TABLE 2

$6^{th}$ order IIR decomposition into three bi-quad SOS stages.

| SOS stages | Numerator coefficients | | | Denominator coefficients | | |
|---|---|---|---|---|---|---|
| SOS I | 0 | −0.1645 | −0.1928 | 1 | 1.4099 | 1 |
| SOS II | 0 | −0.1838 | −0.1829 | 1 | 1.9904 | 1 |
| SOS III | 0 | −0.2511 | −0.0928 | 1 | 0.1838 | 1 |

Using the partial fraction decomposition method, the $6^{th}$ order filter is converted into three SOS for implementation in a parallel bi-quad structure, with the corresponding SOS stage coefficients presented in Table 2. The coefficients for the parallel bi-quad structure, as shown in Table 2, exhibit a significantly smaller range, +2, compared to the coefficients for the DF implementation in Table 1. The reduced range of coefficient values for each SOS stage facilitates the realization of higher-order filters using lower bit widths in the signal paths, thereby reducing quantization errors. Additionally, the total number of multipliers required for the sixth-order filter in the parallel bi-quad structure is 9, resulting in a reduction in the DSP count. The parallel bi-quad structure further allows for flexibility in filter order, enabling the selection of 2, 4, or 6 bi-quad stages as needed. This method is also applied to obtain the SOS stage coefficients for center frequencies at $F_s/4$ and $3F_s/8$.

Figure 5:
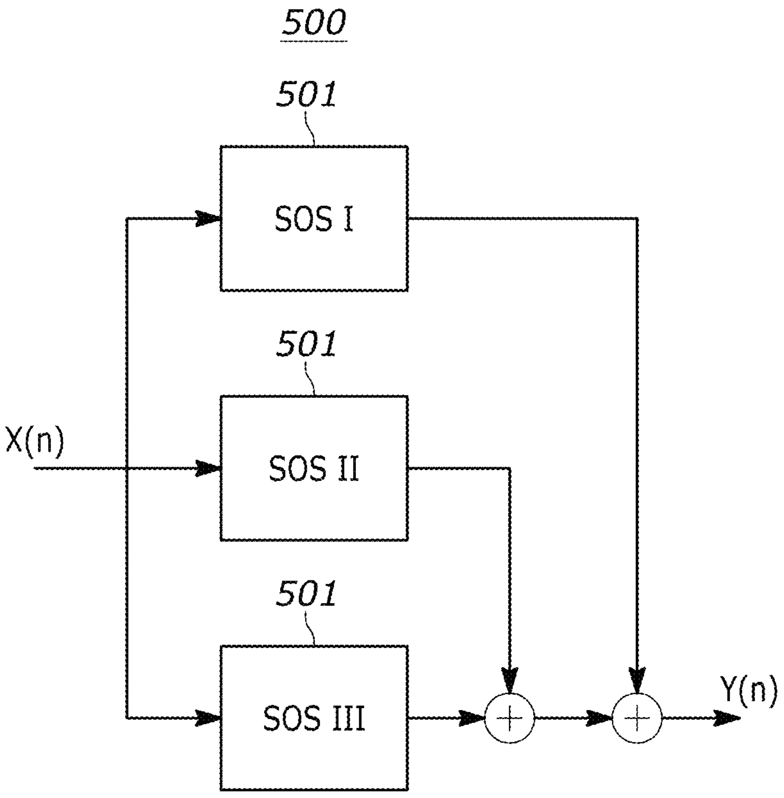
FIG. 5 is a block diagram of an exemplary $6^{th}$ order filter arranged as three bi-quad stages in parallel.

DEM designs for oversampling converters typically utilize a cascade of integrators structure. However, in contrast, the parallel bi-quad structure employed in the present design offers lower latency and is more suitable for the high-speed operation required by Nyquist-rate D/A converters. The implementation of the $6^{th}$ order IIR notch filter 500 using three parallel bi-quad stages 501 is illustrated in FIG. 5. Each bi-quad stage 501 is implemented using a hardware-efficient Direct-Form II (DF-II) structure.

Loop Filter Design for High-Speed Implementation

To enable the loop filter for high-speed operation, the filter can be implemented to reduce latency while ensuring precise signal processing over a broad frequency range. In one embodiment, this can be achieved by using a DSP technique such as pipelining to reduce the critical path delays. Furthermore, reducing the number of required multiplications and simplifying the filter stages contribute to a reduction in the overall DSP load, improving the hardware efficiency for high-speed applications.

Between the VF and TS DEM configurations described above, the TS-DEM may be particularly beneficial for high-speed applications, as the TS-DEM does not involve multiple feedback loops, thereby allowing for the decomposition of the logic. For example, to improve the critical path delay in a 3-bit TS DEM, as illustrated in FIGS. 2A and 2B, with a second-order loop filter having two poles and two zeros, represented by the transfer function:

$$H(z) = \frac{1 - 2\cos\theta z^{-1} + z^{-2}}{1 - 2r\cos\theta z^{-1} + r^2 z^{-2}} \qquad (2)$$

The magnitude and phase response of this second-order noise transfer function (NTF) are shown in the FIG. 4A for $F_s/8$ center frequency. The critical path delay from the input to the output of the DEM is given by $T_m+4T_a+3T_q+3\ T_g$, where $T_m$ is the multiplier delay, $T_a$ is the adder delay, $T_g$ is the quantizer delay, and $T_g$ is the delay of the gain block. To reduce the critical path delay, pipelined registers can be introduced in the feedforward path between the stages of the switching blocks. This modification results in a reduced critical path delay of $T_m+3T_a+T_a+T_g$, which remains within the switching block and helps improve the overall speed of the DEM.

To further enhance the speed of the DEM, the second-order loop filter transfer function can be simplified by reducing the filter to two zeros and one pole at the origin, represented by:

$$H(z) = \frac{1 - 2\cos\theta z^{-1} + z^{-2}}{I} \qquad (3)$$

While the magnitude response of this simplified transfer function (3) is not flat across the entire band and exhibits a gain outside the notch location, as compared to (2), this simplification does not adversely affect the DEM's ability to shape the DAC mismatch errors. This now reduces the critical path to $T_m+2T_a+T_q+T_g$.

To further improve the second-order Noise Transfer Function (NTF), a scattered look-ahead decomposition technique using 2-stage pipelining can be employed, which ensures the stability of the filter transfer function. By applying 2-stage pipelining to equation (3), the NTF becomes:

$$H(z) = \frac{0 + (2\cos\theta)z^{-1} + (1 - 2\cos 2\theta)z^{-2} - z^{-4}}{1 - 2\cos 2\theta z^{-2} + z^{-4}} \qquad (3)$$

Figure 6A:
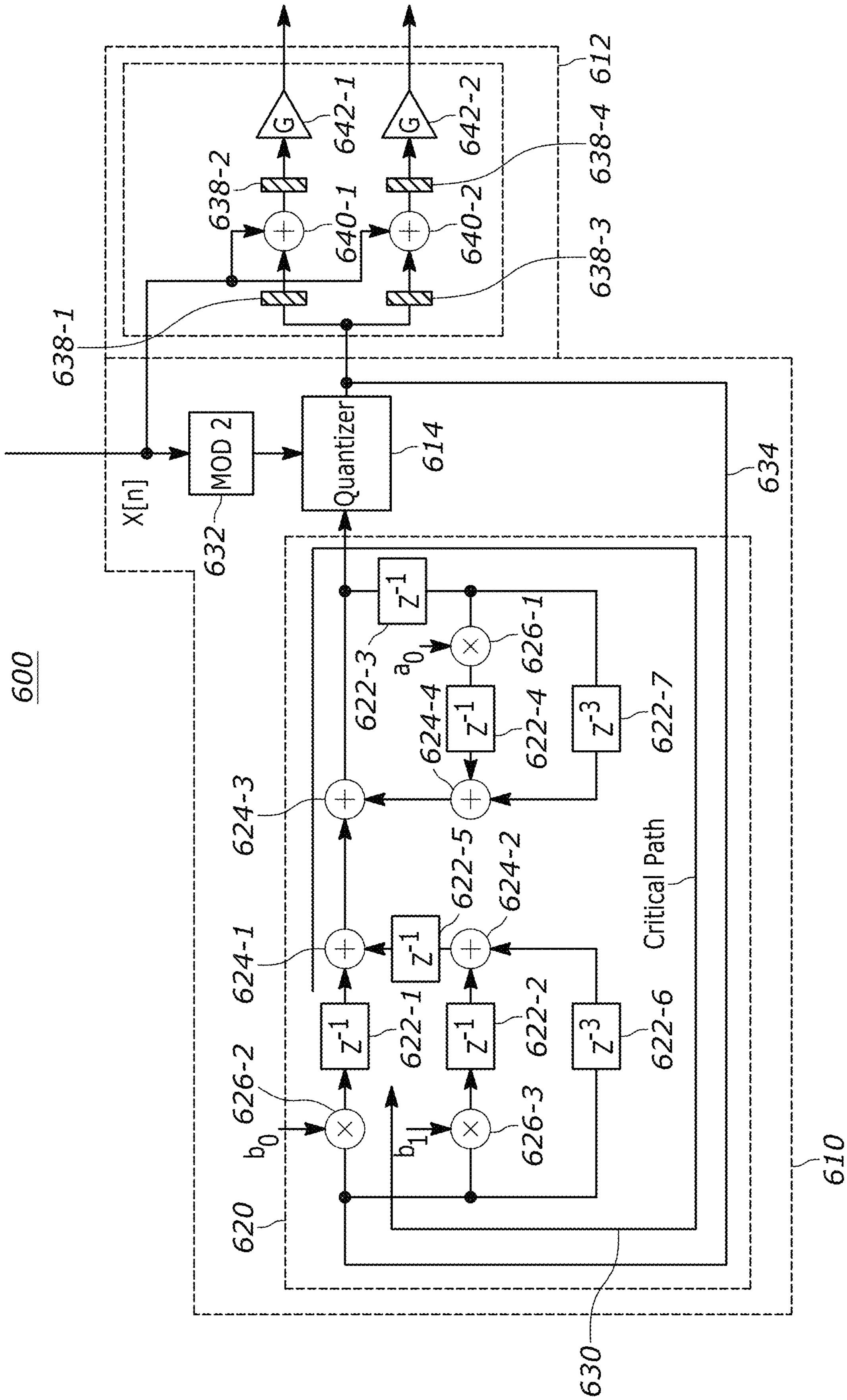
FIG. 6A is a switching block realization using 2-stage pipelining within loop-filter.

FIG. 6A illustrates an example implementation of the NTF after applying 2-stage pipelining. Elements shown in FIG. 6A, which is an example switching block 600 using 2-stage pipelining within a loop filter, include a feedback portion 610 (e.g., including a feedback path) and a feedforward portion 612 (e.g., including a feedforward path). The feedback portion 610 of the switching block 600 includes a quantizer 614 and a loop-filter system 620 in which the loop-filter system includes delay elements 622-1, 622-2, 622-3, 622-4, 622-5, 622-6, and 622-7, adders 624-1, 624-2, 624-3, and 624-4, and multipliers 626-1, 626-2, and 626-3 that are configured to implement pipelining. For example, the loop-filter system is configured to implement the NTF of equation (3). As indicated in FIG. 6A, delay elements 622-1, 622-2, 622-3, 622-4, and 622-5 are configured to implement a $Z^{-1}$ delay and delay elements 622-6, and 622-7 are configured to implement a $Z^{-3}$ delay. Multiplier 626-1 receives $a_0$ as an input, multiplier 626-2 receives $b_0$ as an input, and multiplier 626-3 receives $b_1$ as an input, where $a_0$, $b_0$, and $b_1$ are filter coefficients.

FIG. 6A also indicates a critical path of the loop filter with arrow 630. The feedback portion 610 of the switching block 600 also includes a Mod 2 functional block 632 that receives a digital input, x[n]. FIG. 6A also shows the feedback loop 634 from the output of the quantizer 614 to the input of the loop-filter system 620. As shown in FIG. 6A, via the feedback loop 634, the output of the quantizer 614 is an input to each one of the multipliers 626-2 and 626-3.

The feedforward portion 612 of the switching block 600 includes registers 638-1, 638-2, 638-3, and 638-4, adders 640-1 and 640-2, and gain elements 642-1 and 642-2. The adders 640-1 and 640-2 receive the digital input, x[n], as one input and an output from the quantizer 614 as another input. In an example, the registers 638-1, 638-2, 638-3, and 638-4 in the feedforward path break down the critical path 630. The feedforward portion 612 of the switching block outputs digital signals from the gain elements 642-1 and 642-2 in response to the digital input, x[n], and the digital output from the quantizer 614.

In operation, the switching block 600 can output digital signals from the gain elements 642-1 and 642-2 in response to an input, x[n] and the filter coefficients $a_0$, $b_0$, and $b_1$.

In the example of FIG. 6A, the critical path delay remains at $T_m+2T_a+T_q+T_g$. However, the additional delay blocks introduced by pipelining, as compared to the non-pipelined version, help arrange delay blocks appropriately to break down the logic efficiently.

Figure 6B:
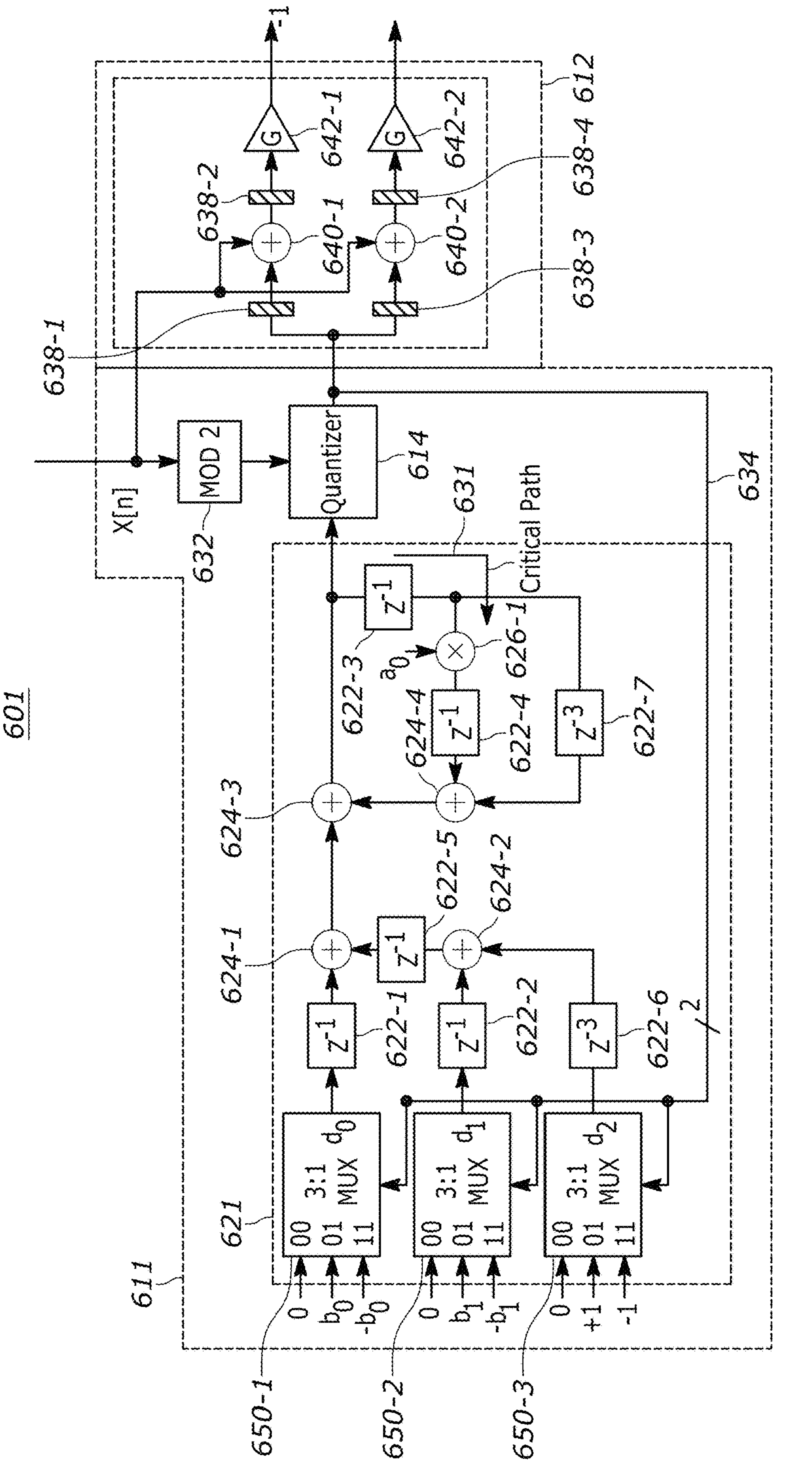
FIG. 6B is a switching block realization using 2-stage pipelining along with pre-computed multiplexers instead of multipliers.

To further increase the speed of the DEM, two of the multipliers 626-2 and 626-3 in the loop-filter system 620 of FIG. 6A can be replaced with multiplexers that utilize pre-computed values. FIG. 6B is an example implementation that includes multiplexers instead of multipliers in two instances. Elements shown in FIG. 6B, which is an example switching block 601 using 2-stage pipelining along with pre-computed multiplexers instead of multipliers, include a feedback portion 611 (e.g., including a feedback path) and a feedforward portion 612 (e.g., including a feedforward path). The feedback portion 611 of the switching block 601 includes a quantizer 614 and a loop-filter system 621 in which the loop-filter system includes delay elements 622-1, 622-2, 622-3, 622-4, 622-5, 622-6, and 622-7, adders 624-1, 624-2, 624-3, and 624-4, a multiplier 626-1 and multiplexers 650-1, 650-2, and 650-3 that are configured to implement pipelining. In the example of FIG. 6B, the multipliers 626-2 and 626-3 from FIG. 6A are replaced with the multiplexers 650-1, 650-2, and 650-3, which utilize pre-computed values. The loop-filter system is also configured to implement the NTF of equation (3). As indicated in FIG. 6B, delay elements 622-1, 622-2, 622-3, 622-4, and 622-5 are configured to implement a $Z^{-1}$ delay and delay elements 622-6, and 622-7 are configured to implement a $Z^{-3}$ delay. Multiplier 626-1 receives $a_0$ as an input, multiplexer 650-1 receives 0, $b_0$, and $-b_0$ as inputs, multiplexer 650-2 receives 0, $b_1$, and $-b_1$ as inputs, and multiplexer 650-3 receives 0, +1, and −1 as inputs, where $a_0$, $b_0$, and $b_1$ are filter coefficients. The output of multiplexer 650-1, do, is provided to the delay element 622-1, the output of multiplexer 650-2, $d_1$, is provided to the delay element 622-2, and the output of multiplexer 650-3, $d_2$, is provided to the delay element 622-6.

FIG. 6B also indicates a critical path of the loop filter with arrow 631. The feedback portion 611 of the switching block 601 also includes a Mod 2 functional block 632 that receives a digital input, x[n]. FIG. 6B also shows the feedback loop 634 from the output of the quantizer 614 to the input of the loop-filter system 621. As shown in FIG. 6B, via the feedback loop 634, the output of the quantizer 614 is an input to each one of the multiplexers 650-1, 650-2, and 650-3.

The feedforward portion 612 of the switching block 601 includes registers 638-1, 638-2, 638-3, and 638-4, adders 640-1 and 640-2, and gain elements 642-1 and 642-2. The adders 640-1 and 640-2 receive the digital input, x[n], as one input and an output from the quantizer 614 as another input. In an example, the registers 638-1, 638-2, 638-3, and 638-4 in the feedforward path break down the critical path 631. The feedforward portion 612 of the switching block outputs digital signals from the gain elements 642-1 and 642-2 in response to the digital input, x[n], and the digital output from the quantizer 614.

In operation, the switching block 601 can output digital signals from the gain elements 642-1 and 642-2 in response to an input, X[n] and the filter coefficients $a_0$, $b_0$, and $b_1$.

The example of FIG. 6B results in a critical path delay of either $2T_a+T_q$ or $T_m+T_a$, where the multiplier delay exceeds that of the adder delay. Therefore, using the configurations as shown in FIGS. 6A and 6B, the critical path delay of the TS-DEM logic can be reduced to a combination of a multiplier delay, $T_m$, and a quantizer delay, $T_q$, for any bit-width implementation.

The example switching blocks 600 and 601 of FIGS. 6A and 6B, respectively, can be implemented as switching blocks in a TS-DEM. Additionally, the example switching blocks 600 and 601 of FIGS. 6A and 6B, respectively, can be implemented as hardware circuits in an integrated circuit (IC) device for high-speed operation. For example, the switching blocks 600 and 601 of FIGS. 6A and 6B, respectively, can be implemented in an application specific integrated circuit (ASIC) or a field programmable gate array (FPGA) IC device.

FIGS. 6A and 6B are examples of switching blocks 600 and 601 that include loop-filter systems 620 and 621, respectively. It should be noted that loop-filter systems similar to the loop-filter systems 620 and 621 may be implemented in a VF DEM system, such as the system described with reference to FIGS. 1A and 1B. For example, a VF DEM system may include loop-filter systems that utilize delay elements, adders, multipliers, and optionally multiplexers as described above to implement pipelining, such as scattered look-ahead power of 2 decomposition pipelining. In another example, loop-filter systems similar to the loop-filter systems 620 and 621 may be implemented in a butterfly shuffler DEM system.

Although the loop-filter systems 600 and 601 are implemented as scattered look-ahead power of 2 decomposition filters, a loop-filter system for a DEM system can be implemented using other pipelining techniques such as clustered look ahead pipelining, scattered look-ahead general decomposition etc.

Additionally, although the loop-filter systems 600 and 601 are described as second-order NTF filters, the pipelining techniques can be applied to any order of the filter, including, for example, $4^{th}$ and $6^{th}$ order.

Results

The programmable sixth-order bandpass mismatch-shaping DEM was verified using the Xilinx Sys-Gen tool for a 12-bit Nyquist DAC with 5T-7B segmentation. The VF and TS DEM hardware for the upper five MSB DAC bits was implemented within the Xilinx Sys-Gen environment, utilizing built-in adders, multipliers, delay elements, and M-code blocks, with a target implementation on the Zynq UltraScale+ FPGA (xczu7ev-ffvc1156-2e). The FPGA logic resources used for the VF and TS DEM configurations are summarized in Tables 3 and 4, respectively. The latency of the VF and TS DEM in Sys-Gen, when no design constraints are applied, was measured at 6.43 ns and 6.41 ns, respectively, indicating that both DEM configurations can operate at up to 155 MHz sampling frequency ($F_s$). The programmable coefficient word-lengths and data path lengths within the DEM filter were determined to be 10 and 11 bits, respectively. These bit widths were found to be sufficient to ensure low round-off noise and maintain the accuracy of the results.

TABLE 3

$6^{th}$ order programmable bandpass VF DEM FPGA logic resources.

| Logic type | DSPs | LUTS | Registers |
|---|---|---|---|
| No. of units | 288 | 12515 | 2112 |

TABLE 4

$6^{th}$ order programmable bandpass TS DEM FPGA logic resources.

| Logic type | DSPs | LUTS | Registers |
|---|---|---|---|
| No. of units | 288 | 5270 | 2232 |

TABLE 5

$6^{th}$ order VF-DEM on/off min, max and average SNDR, SFDR and IMD3 results for a 12-bit Nyquist DAC at $F_s/8$, $F_s/4$, and $3F_s/8$ centre-frequencies using 100 MC runs.

| | Ideal | VF-DEM off | | | VF-DEM on | | |
|---|---|---|---|---|---|---|---|
| | Avg. | Min. | Max. | Avg. | Min. | Max. | Avg. |
| At $F_s/8$ centre-frequency | | | | | | | |
| SNDR (dB) | 77.5 | 67.51 | 74.95 | 71.60 | 66.96 | 69.74 | 68.38 |
| SFDR (dB) | 96 | 70.19 | 83.89 | 77.83 | 88.22 | 92.00 | 90.21 |
| IMD3 (dB) | 96 | 66.91 | 82.12 | 75.5 | 85.06 | 89.48 | 87.27 |
| At $F_s/4$ centre-frequency | | | | | | | |
| SNDR (dB) | 77.5 | 61.71 | 73.20 | 68.15 | 68.81 | 69.97 | 69.44 |
| SFDR (dB) | 96 | 62.24 | 81.27 | 72.27 | 89.08 | 92.00 | 90.79 |
| IMD3 (dB) | 96 | 63.34 | 74.28 | 71.60 | 80.64 | 83.50 | 82.01 |
| At $3F_s/8$ centre-frequency | | | | | | | |
| SNDR (dB) | 77.5 | 68.02 | 74.81 | 72.55 | 66.46 | 69.44 | 68.20 |
| SFDR (dB) | 96 | 70.19 | 84.93 | 78.77 | 88.27 | 91.75 | 89.84 |
| IMD3 (dB) | 96 | 66.24 | 79.93 | 71.72 | 85.31 | 92.00 | 89.57 |

Figure 7A:
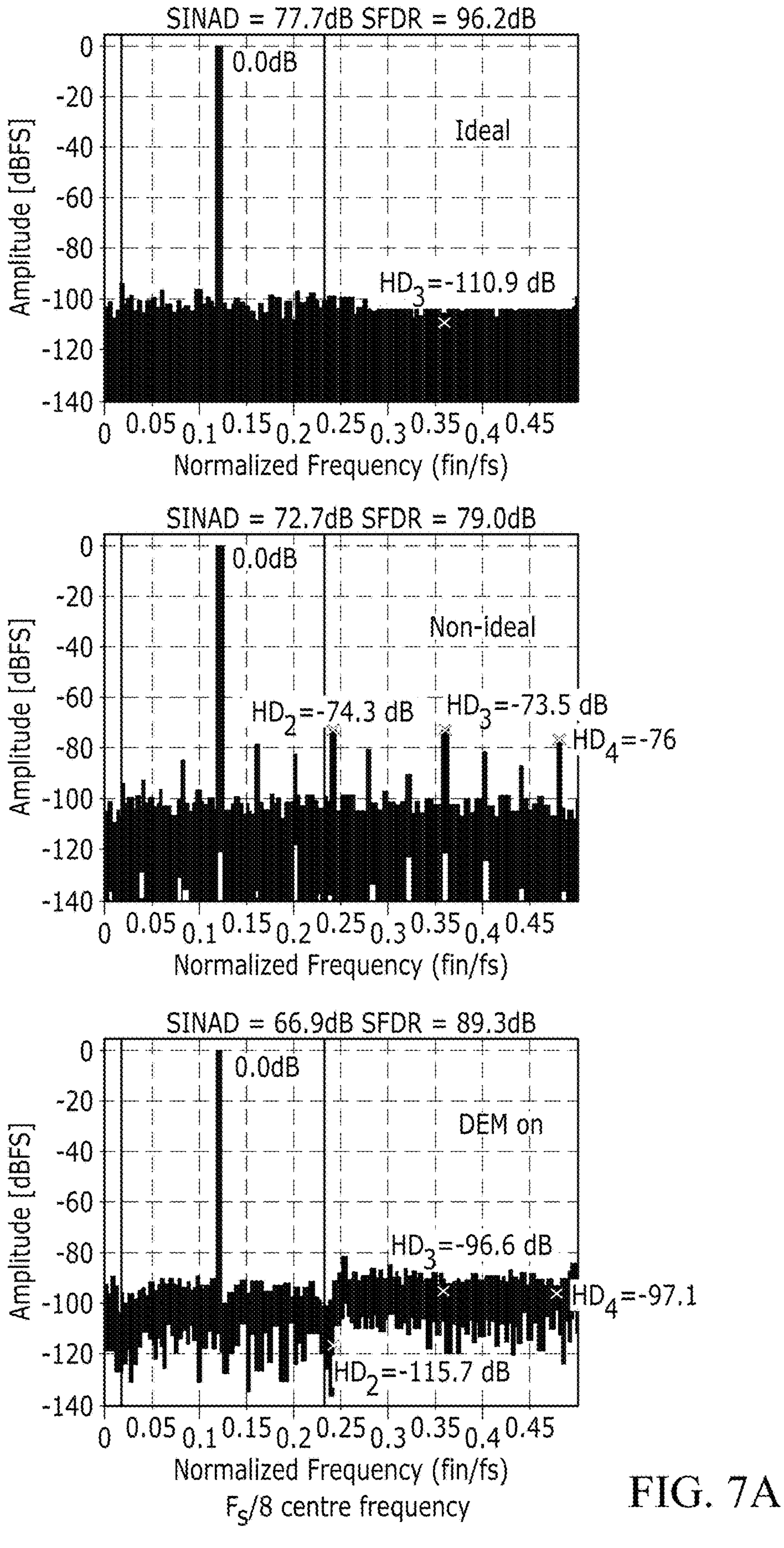
FIG. 7A shows ideal, non-ideal and $6^{th}$ order VF-DEM enabled spectrum plots showing SNDR and SFDR for a 12-bit Nyquist DAC at $F_s/8$ center frequency.
Figure 7B:
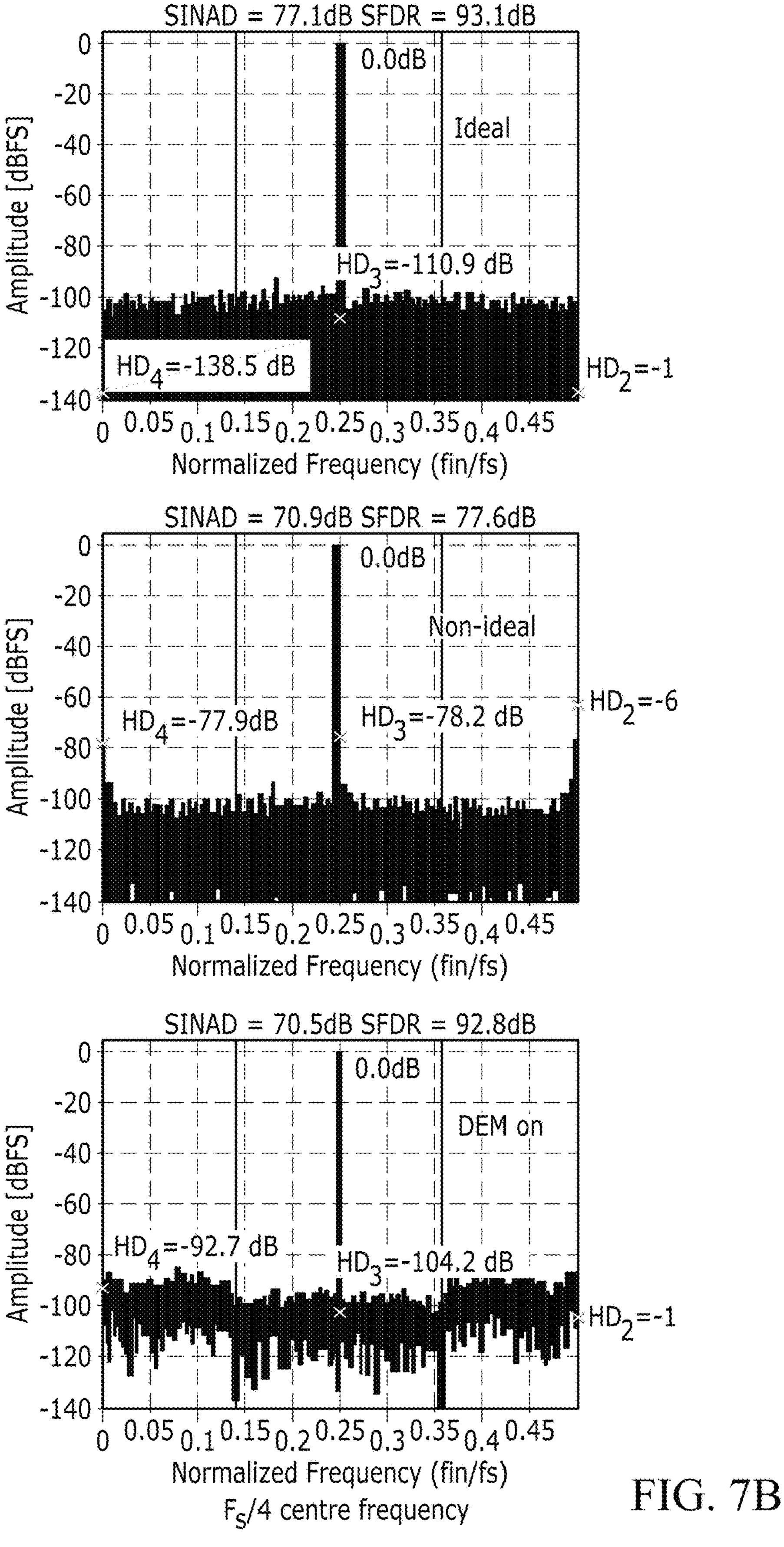
FIG. 7B shows ideal, non-ideal and $6^{th}$ order VF-DEM enabled spectrum plots showing SNDR and SFDR for a 12-bit Nyquist DAC at $F_s/4$ center frequency.
Figure 7C:
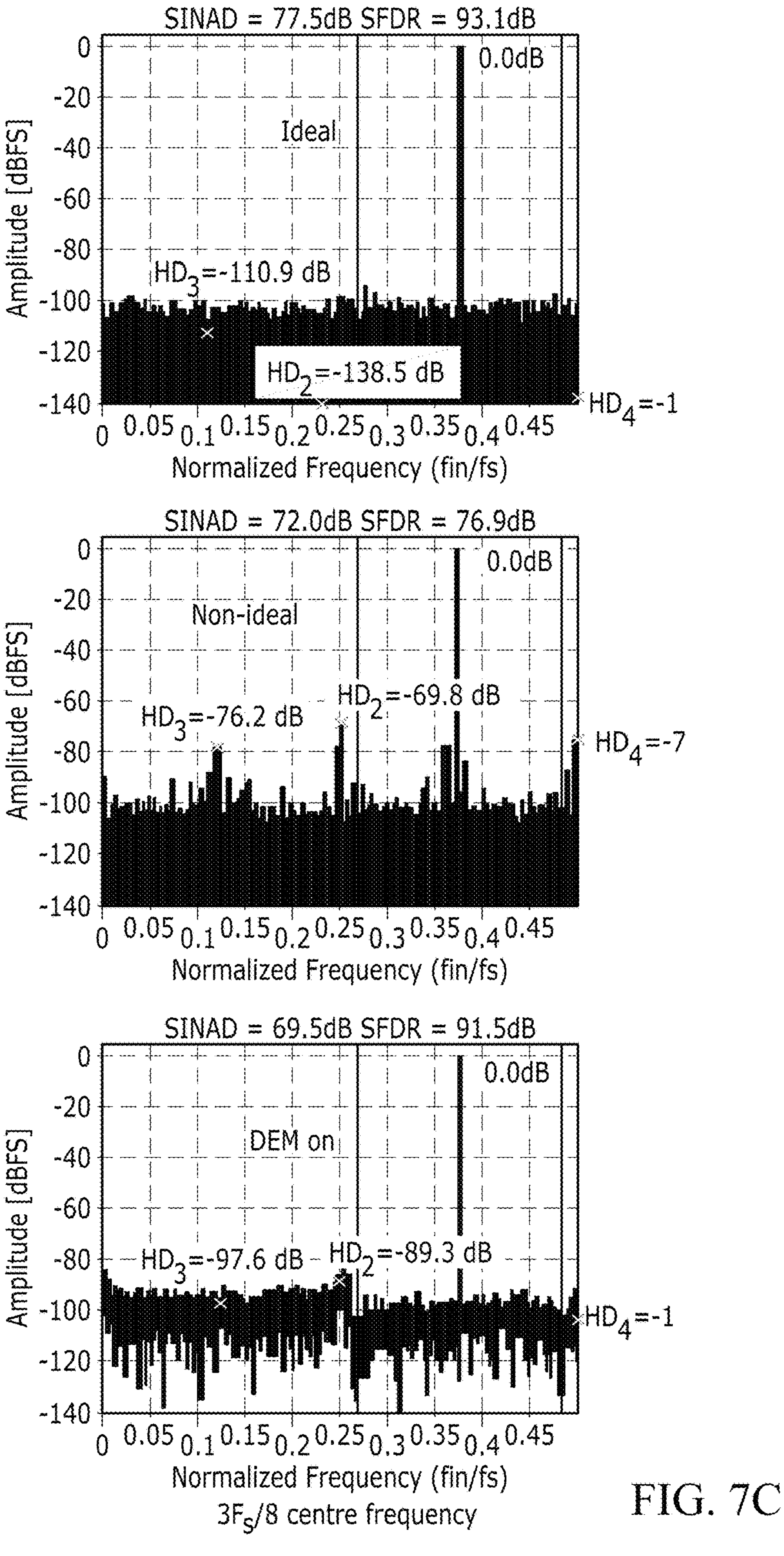
FIG. 7C shows ideal, non-ideal and $6^{th}$ order VF-DEM enabled spectrum plots showing SNDR and SFDR for a 12-bit Nyquist DAC at $3F_s/8$ center frequency.

The $6^{th}$ order on/off VF-DEM single tone spectrum for a 12-bit Nyquist DAC at $F_s/8$, $F_s/4$, and $3F_s/8$ center-frequencies are shown in FIGS. 7A, 7B, and 7C, respectively. Here, the input-tone is chosen close to the center-frequencies and the performance is evaluated over 20% of $F_s$. These results are for a 0.5% Gaussian distributed mismatch error on the DAC elements.

Figure 8A:
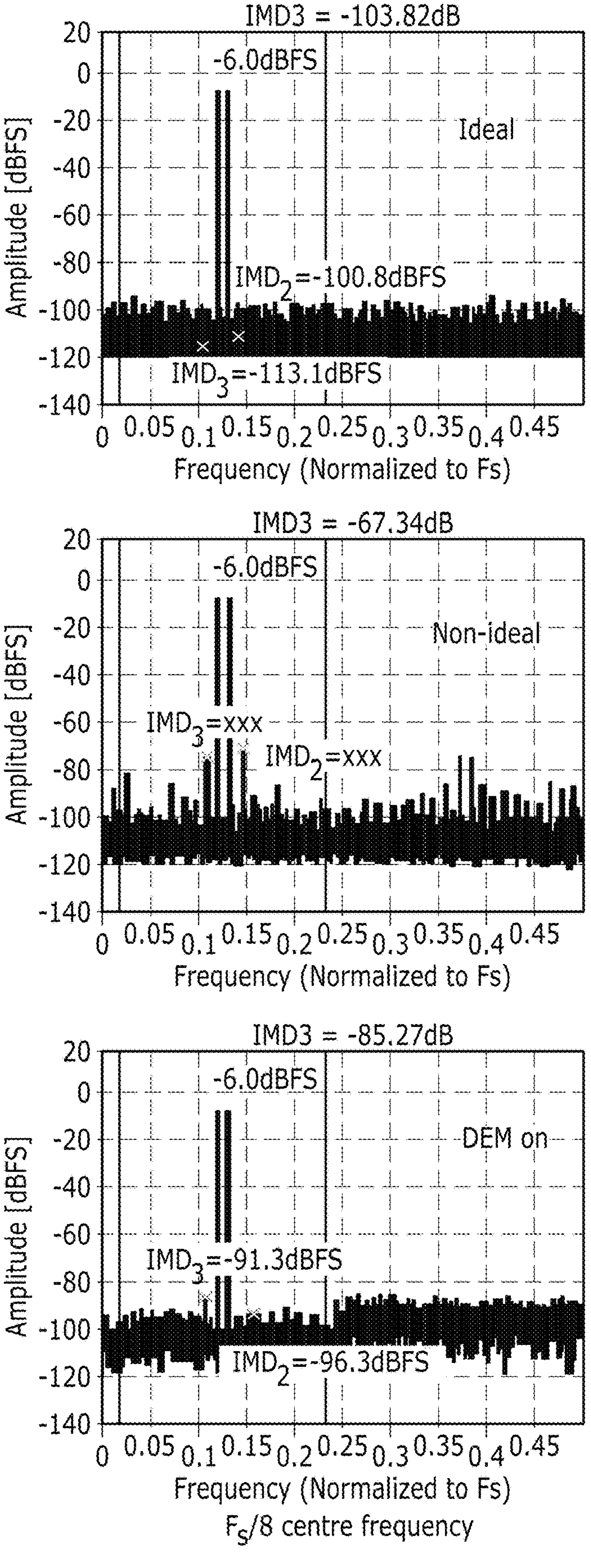
FIG. 8A shows ideal, non-ideal and $6^{th}$ order VF-DEM enabled two-tone spectrum plots showing IMD3 for a 12-bit Nyquist DAC at $F_s/8$ center frequency.
Figure 8B:
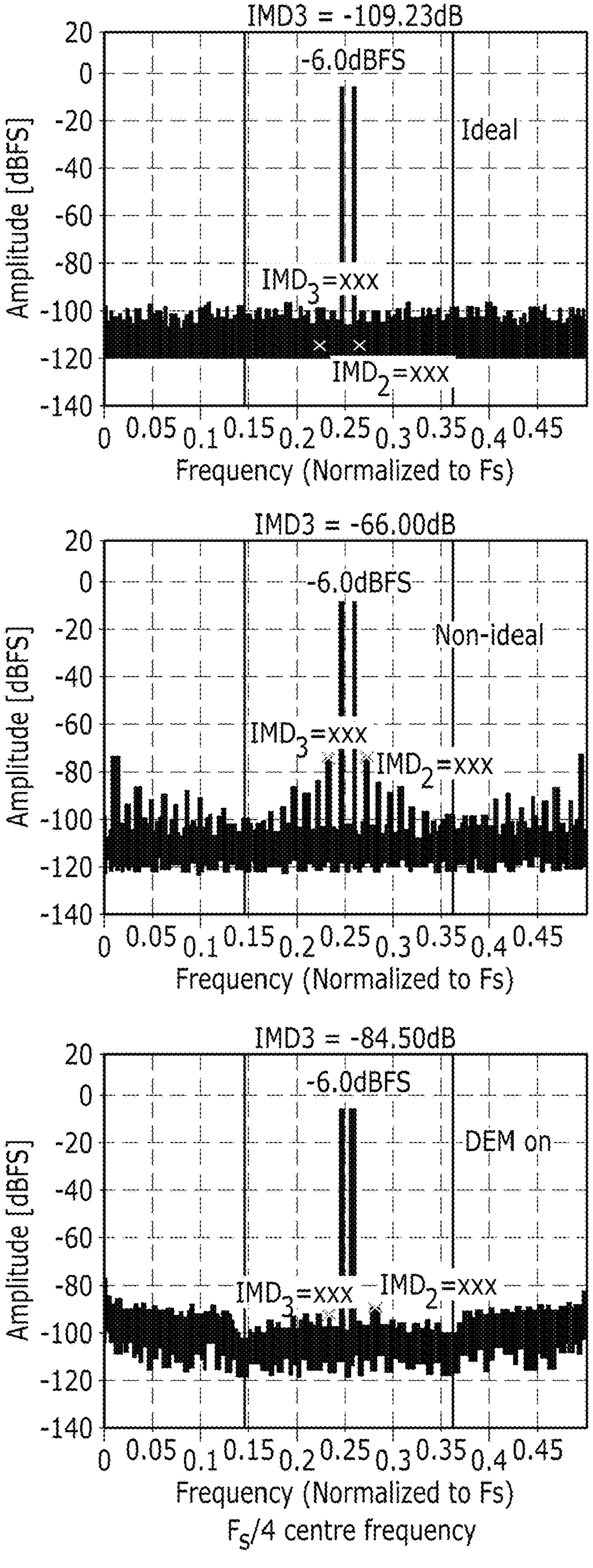
FIG. 8B shows ideal, non-ideal and $6^{th}$ order VF-DEM enabled two-tone spectrum plots showing IMD3 for a 12-bit Nyquist DAC at $F_s/4$ center frequency.
Figure 8C:
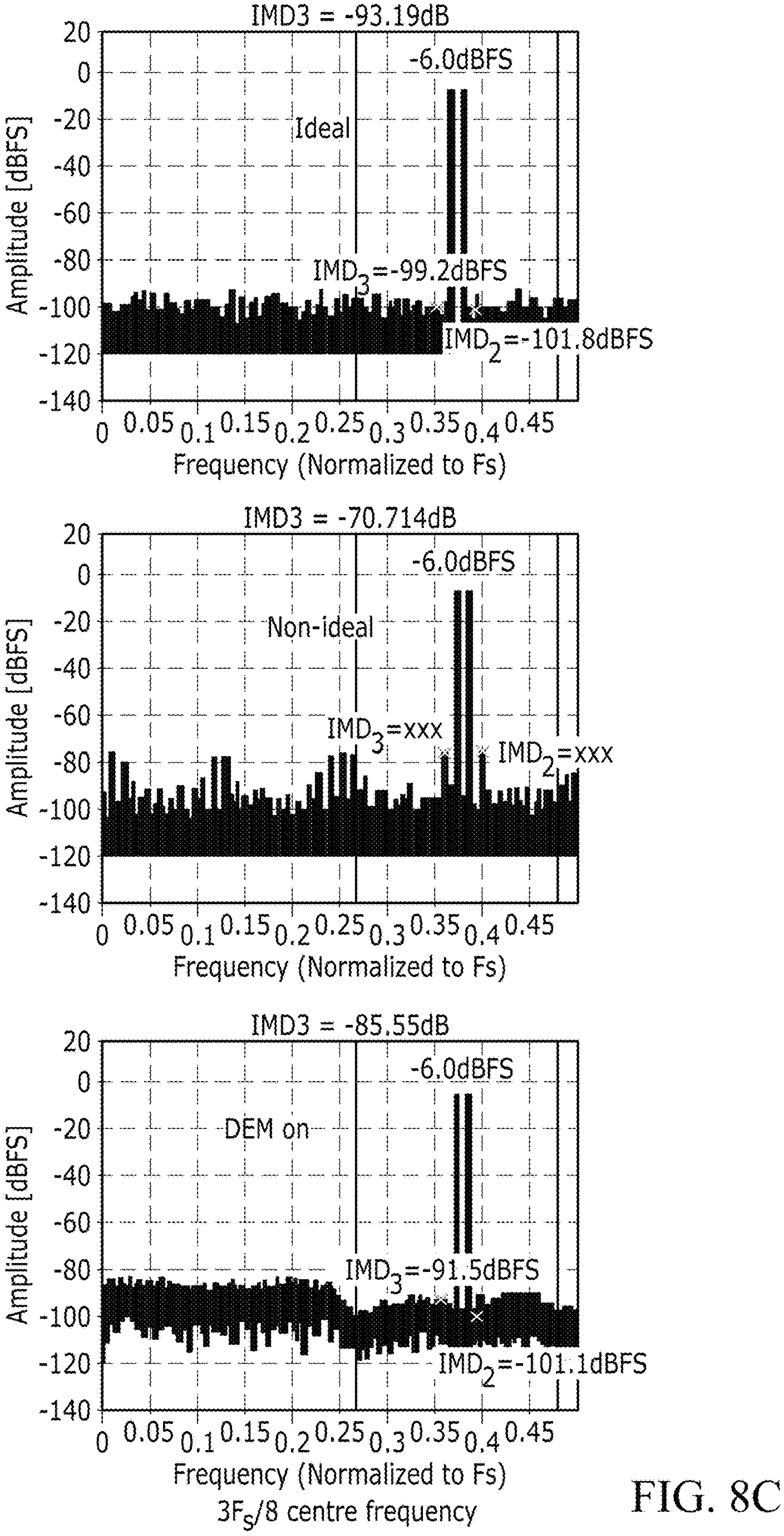
FIG. 8C shows ideal, non-ideal and $6^{th}$ order VF-DEM enabled two-tone spectrum plots showing IMD3 for a 12-bit Nyquist DAC at $3F_s/8$ center frequency.

FIGS. 8A, 8B, and 8C show the VF-DEM on/off dual tone IMD3 results for a 12-bit Nyquist DAC at $F_s/8$, $F_s/4$, and $3F_s/8$ centre frequencies. Here, two tones are placed around ±5% of the centre-frequencies.

The min, max and average SNDR, SFDR and IMD3 results for $6^{th}$ order on/off VF-DEM using 100 Monte-Carlo (MC) runs at $F_s/8$, $F_s/4$, and $3F_s/8$ center-frequencies are tabulated in Table 5. The table shows that the SFDR and IMD3 performance of the DAC improves ~12 dB and ~10 dB respectively over a wide-band for the $6^{th}$ order VF-DEM enabled case.

Preferably, the order of the loop-filter for the DEM can be set to "2" or "4". Further, the mismatch error can be shaped over the desired band at different choice of centre frequencies. As a result, e.g. $6^{th}$ order tunable bandpass DEM uses only one bi-quad stage for a $2^{nd}$ order filter and two bi-quad stages for a $4^{th}$ order filter.

The simulation results show that a TS DEM has similar performance as that of VF DEM for an order 2, 4 and 6 using the same number of DAC elements and the same amount of mismatch error on the DAC elements.

Amplitude and timing error mitigating programmable bandpass DEM

Solutions for addressing amplitude and timing errors at low frequencies, specifically near DC, in oversampled sigma-delta DACs are known in the art. However, the present disclosure extends these solutions by incorporating additional redundant DAC elements and encoder blocks within the DEM logic, thereby enabling its application for full Nyquist-rate operation.

Figure 9:
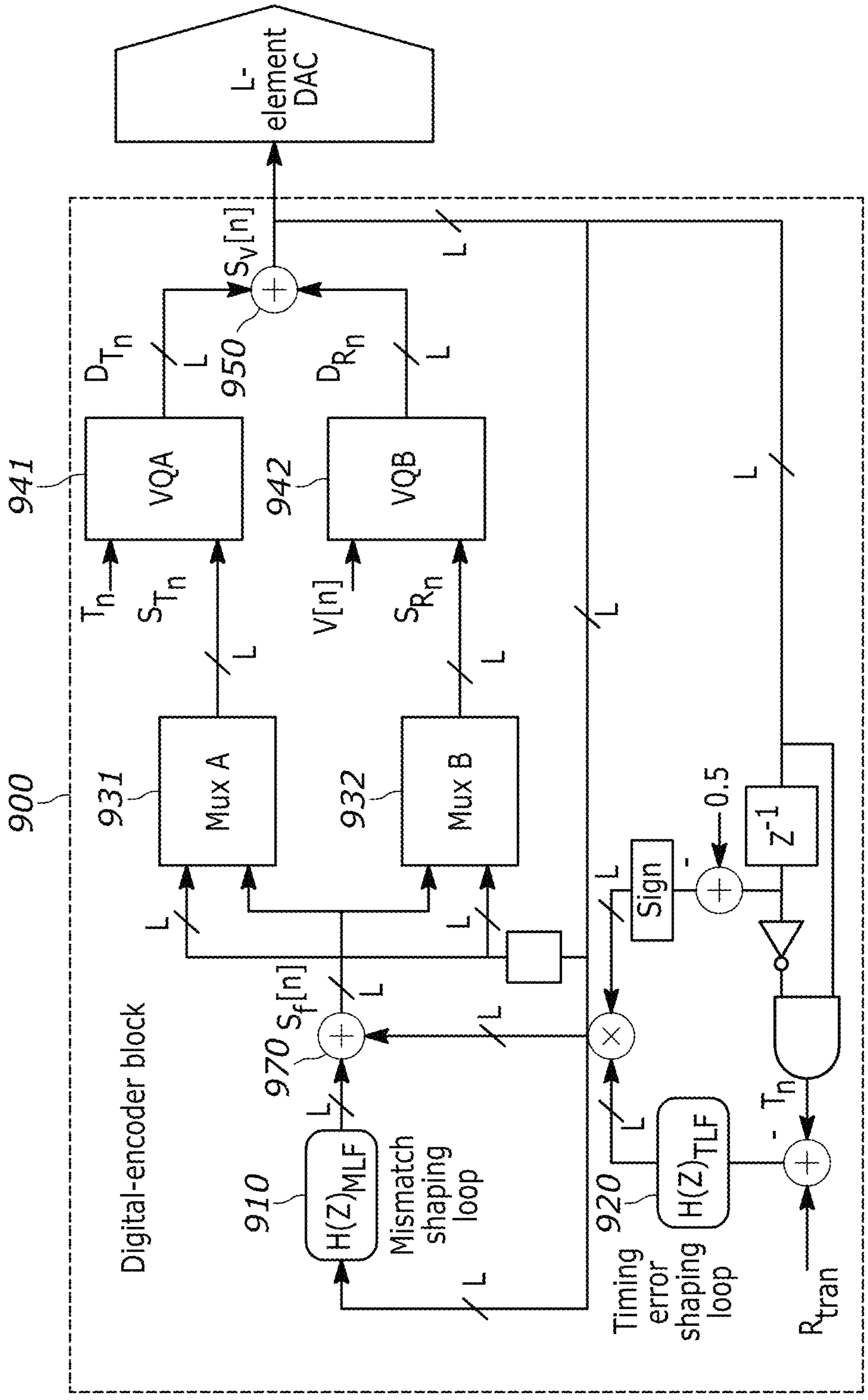
FIG. 9 is a block diagram of an exemplary a DEM for mitigating static and dynamic mismatch errors of the Nyquist DAC.

The disclosed DEM system 900, as shown in FIG. 9, simultaneously shapes both mismatch and timing-skew errors based on the characteristics of the loop filters employed. The system includes a mismatch loop-filter $H(Z)_{MLF}$ 910, a timing error loop-filter $H(Z)_{TLF}$ 920, two multiplexers muxA 931, muxB 932, and two vector quantizers, namely VQA 941 and VQB 942.

To ensure proper operation of the DEM solution while maintaining a constant number of ON transitions for shaping both amplitude and timing errors across any input signal over the first Nyquist band, L encoder blocks are employed. In this embodiment, L is defined as three times the number of DAC elements M, where M is equal to $2^N$, and N represents the number of thermometer-decoded DAC bits. The L encoder blocks are depicted in parallel, as indicated by the thick line in the figure. By utilizing three times the number of DAC elements in encoder blocks, the DEM system is capable of flexibly selecting the appropriate number of DAC elements while preventing the repetition of selection patterns in a periodic manner, regardless of the input signal over the first Nyquist band. Additionally, the MSB signal V[n], in combination with a constant number of ON transitions $T_n$ for a given input signal over the first Nyquist band, remains within the range defined by L.

For a Nyquist-rate D/A converter, to achieve the simultaneous shaping of mismatch and timing errors while controlling ON transitions in the DEM encoder block, the following conditions should be satisfied:

At each sample time n, the sum of the DEM output elements in vector $S_v[k]$ must be equal to the MSB signal V[n] plus the constant number of ON transitions, $T_n$.

The number of ON elements at each cycle, denoted as $T_n$, is set to a constant value. The constant value corresponds to the maximum number of ON transitions for the MSB portion of an input signal ($f_{in}$) within the DC to $F_s/2$ frequency range.

At each cycle, the constant number of ON transitions $T_n$ and the MSB signal V[n] are inputs to vector quantizers VQA 941 and VQB 942, respectively. For each sample time n, the $T_n$ value represents the number of elements to be turned ON, and the V[n] value represents the number of elements that should remain ON. Vector quantizer VQA 941 assigns the value '1' to elements in vector $D_{T_n}$ by prioritizing the largest values in vector $S_{T_n}$, based on the $T_n$ value. Similarly, vector quantizer VQB 942 assigns the value '1' to elements in vector $D_{R_n}$ by prioritizing the largest values in vector $S_{R_n}$, based on the V[n] value. The outputs from both vector quantizers (i.e., VQA and VQB) are combined using adder 950 to generate the output vector $S_v[n]$. The output vector $S_v[n]$ contains elements with a one-bit signal value, either '1' or '0'.

In the disclosed DEM system, vector quantizer VQA 941 is configured to activate the DAC elements at cycle n that were deactivated at cycle n−1, while vector quantizer VQB 942 retains the DAC elements in the ON state at cycle n that were also ON at cycle n−1. The outputs of the mismatch loop filter $H(Z)_{MLF}$ 910 and the timing error loop filter $H(Z)_{TLF}$ 920 are combined through adder 970. The output from adder 870 is provided as an input to mux A 931 and mux B 932. Mux A 931 is configured to invert the values contained in the digital vector $S_v[n]$ and apply a masking operation to the values in $S_f[n]$, resulting in the $S_{T_n}$ vector. Conversely, mux B 932 utilizes the values in $S_v[n]$ to mask the values in $S_f[n]$ to generate the $S_{R_n}$ vector.

In the present DEM system, the mismatch loop-filter, $H(Z)_{MLF}$, and the timing error loop-filter, $H(Z)_{TLF}$, shape the mismatch and timing-skew errors, respectively, around the center frequency. Additionally, for a selected input frequency $f_{in}$, the timing-error shaping loop strives to maintain an equal transition density, $R_{tran}$, for each DAC segment. Equalizing the transition density $R_{tran}$ across the DAC segments eliminates distortion tones induced by timing-skew errors. The value of $R_{tran}$ is defined as the ratio of $f_{in}$ to the sampling frequency $F_s$. For example, when $f_{in}$ is chosen $F_s/8$, the $R_{tran}$ value is 0.125. By maintaining a constant number of ON transitions for the most significant bits (MSB) of the input signal, the DEM system ensures that common-duty cycle errors are converted to a DC value.

The disclosed system further provides flexibility in the configuration of the loop filters, where the order of both the mismatch loop-filter, $H(Z)_{MLF}$, and the timing error loop-filter, $H(Z)_{TLF}$, can be selected from 2, 4, or 6. The system also enables the shaping of random amplitude and random timing errors via a bandpass DEM response, with the ability to adjust the center frequency within the first Nyquist band. The DEM solution is designed for use with up to five MSB bits of a Nyquist DAC. However, as the number of MSB bits exceeds five, the complexity of the DEM logic increases exponentially due to the additional logic required for implementing VQs and both loop filters. The increased thermometer bits increase the hardware complexity of the DEM block leading to an increase in overall design area.

In the present DEM system, the mismatch loop-filter, $H(Z)_{MLF}$ and the timing error loop-filter, $H(Z)_{TLF}$, shape the mismatch and timing-skew errors, respectively, around the center-frequency. Furthermore, for a chosen $f_{in}$, the timing-error shaping loop tries to maintain an equal transition density $R_{tran}$ value for each DAC segment. Equalizing the $R_{tran}$ of each DAC segment eliminates the distortion tones induced due to timing-skew errors. The $R_{tran}$ is the ratio of $f_{in}$ and $F_s$. For example, if $f_{in}$ is chosen to be $F_s/8$, the $R_{tran}$ value is 0.125. For the DEM system, choosing the constant number of ON transitions for the MSB part of an input-signal, ensures the common-duty cycle error translates to a dc value.

In the present disclosure, the order of both $H(Z)_{MLF}$ and $H(Z)_{TLF}$ can be selected to 2, 4 or 6. Moreover, the random amplitude and random timing error can be shaped using bandpass DEM response for any choice of the centre-frequency over the first Nyquist band. The proposed DEM solution is suitable for implementation with up to five MSB bits of the Nyquist DAC. However, for MSB DAC bits above five, the DEM logic increases exponentially due to the logic required to implement VQs, and both the loop filters. The increased thermometer bits increase the hardware complexity of the DEM block leading to an increase in overall design area.

In an example, the loop-filter systems as described with reference to FIGS. 6A and 6B can be implemented for the mismatch loop-filter, $H(Z)_{MLF}$, and/or the timing error loop-filter, $H(Z)_{TLF}$, in the system of FIG. 9.

Simulation Results

The DEM system of the present disclosure was verified for a 12-bit (5T-7B segmentation) Nyquist rate DAC using the MATLAB/Simulink behavioural implementations. The mismatch-shaping-loop-filter $H(Z)_{MLF}$ and the timing-error-loop-filter $H(Z)_{TLF}$ order is set to 2. The design logic is implemented in Simulink for the 5-bit (32-element) MSB segment of the Nyquist DAC. As discussed in the previous section, for full Nyquist operation of the 5-bit DAC that is employed in the MSB path of a 12-bit segmented DAC, the number of elements required are 96 (3×32).

Figure 10A:
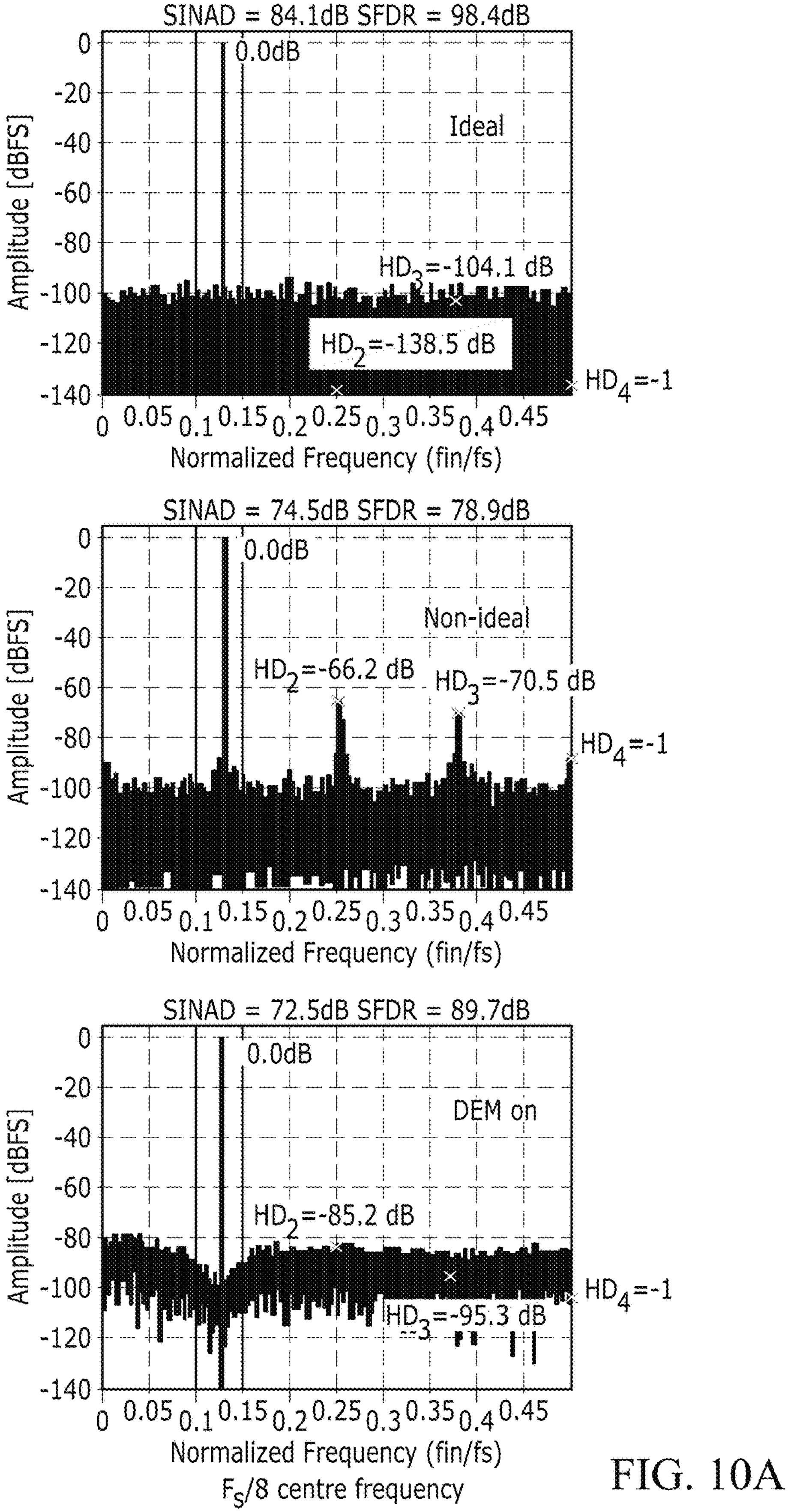
FIG. 10A shows ideal, non-ideal and $2^{nd}$ order amplitude and timing error shaping DEM enabled spectrum plots showing SNDR and SFDR for a 12-bit Nyquist DAC at $F_s/8$ center frequency.
Figure 10B:
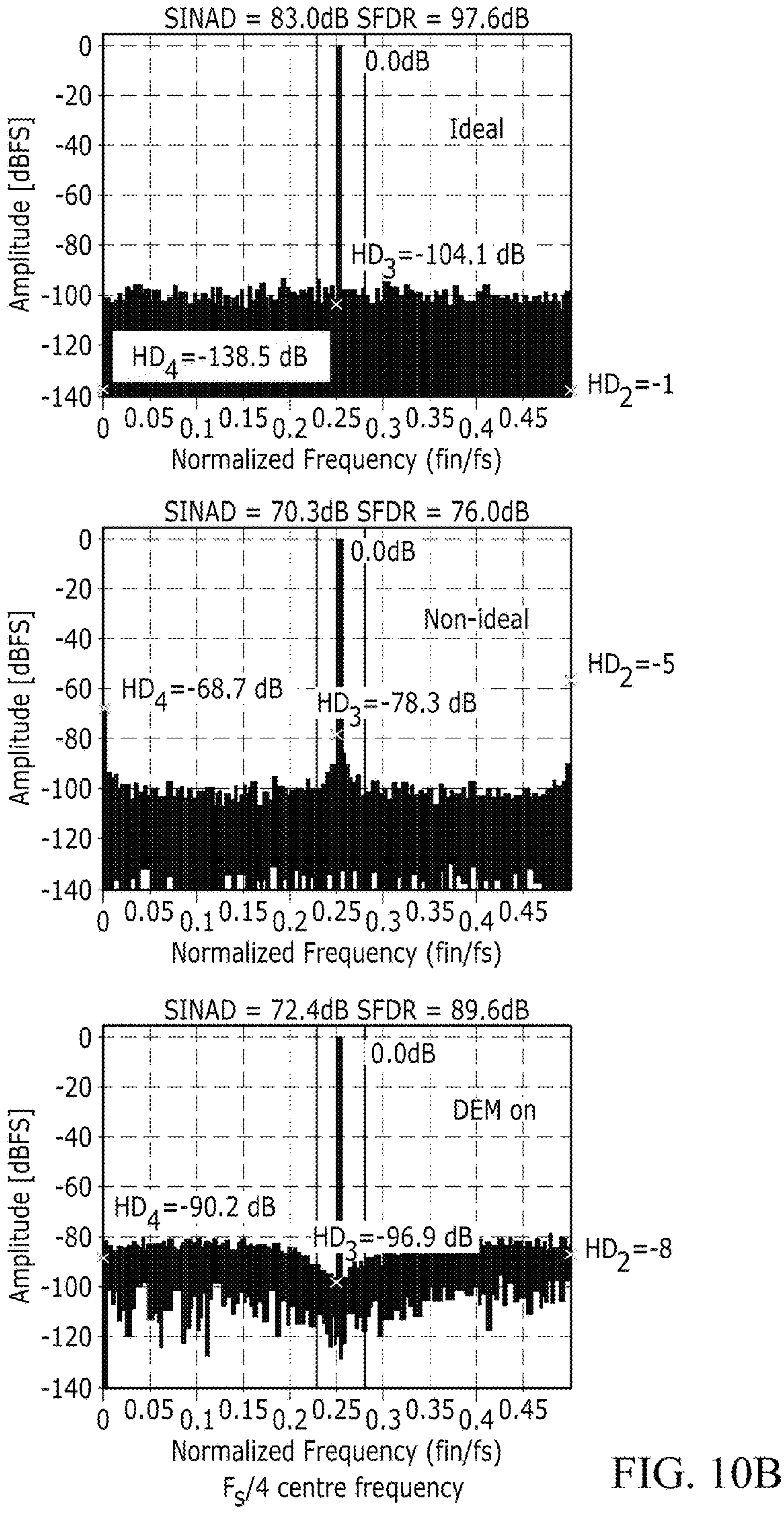
FIG. 10B shows ideal, non-ideal and $2^{nd}$ order amplitude and timing error shaping DEM enabled spectrum plots showing SNDR and SFDR for a 12-bit Nyquist DAC at $F_s/4$ center frequency.
Figure 10C:
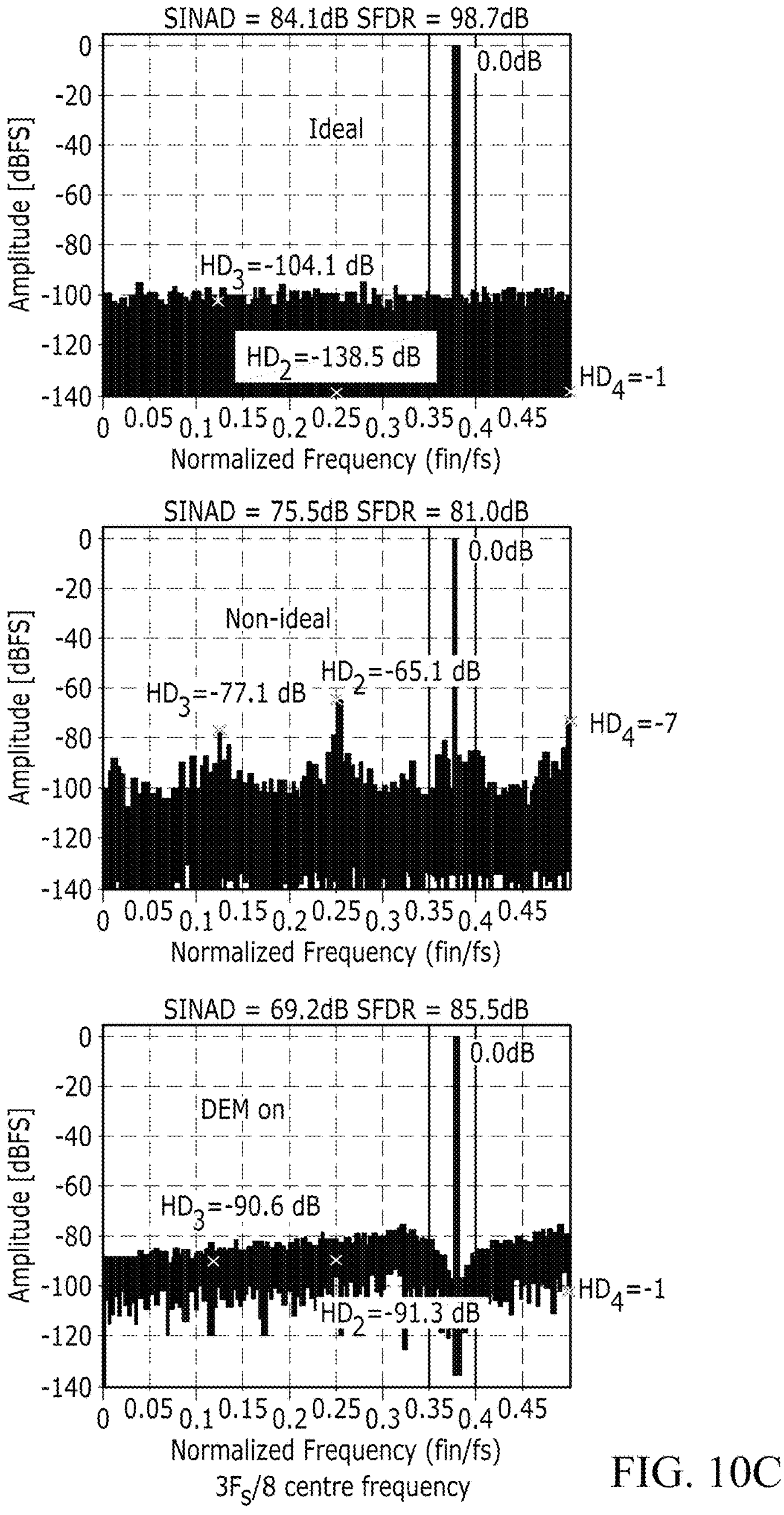
FIG. 10C shows ideal, non-ideal and $2^{nd}$ order amplitude and timing error shaping DEM enabled spectrum plots showing SNDR and SFDR for a 12-bit Nyquist DAC at $3F_s/8$ center frequency.
Figure 11A:
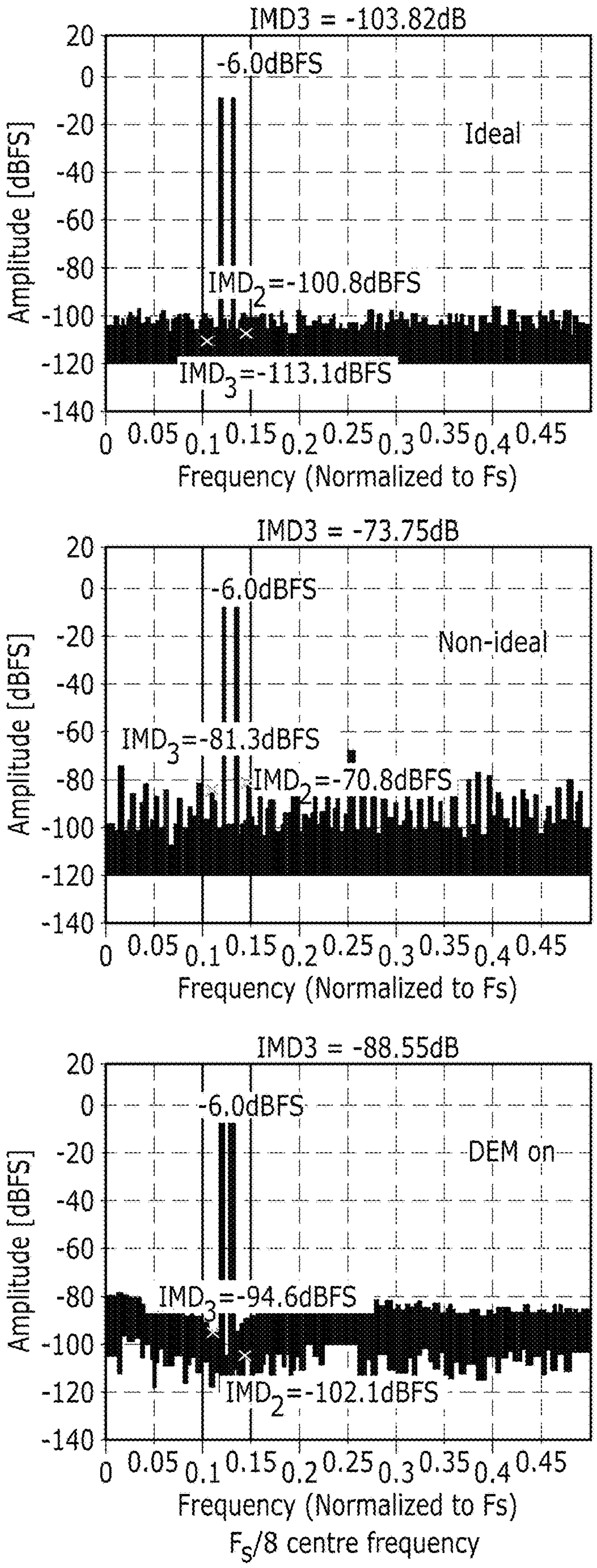
FIG. 11A shows ideal, non-ideal and $2^{nd}$ order amplitude and timing error shaping DEM enabled two-tone spectrum plots showing IMD3 for a 12-bit Nyquist DAC at $F_s/8$ center frequencies.
Figure 11B:
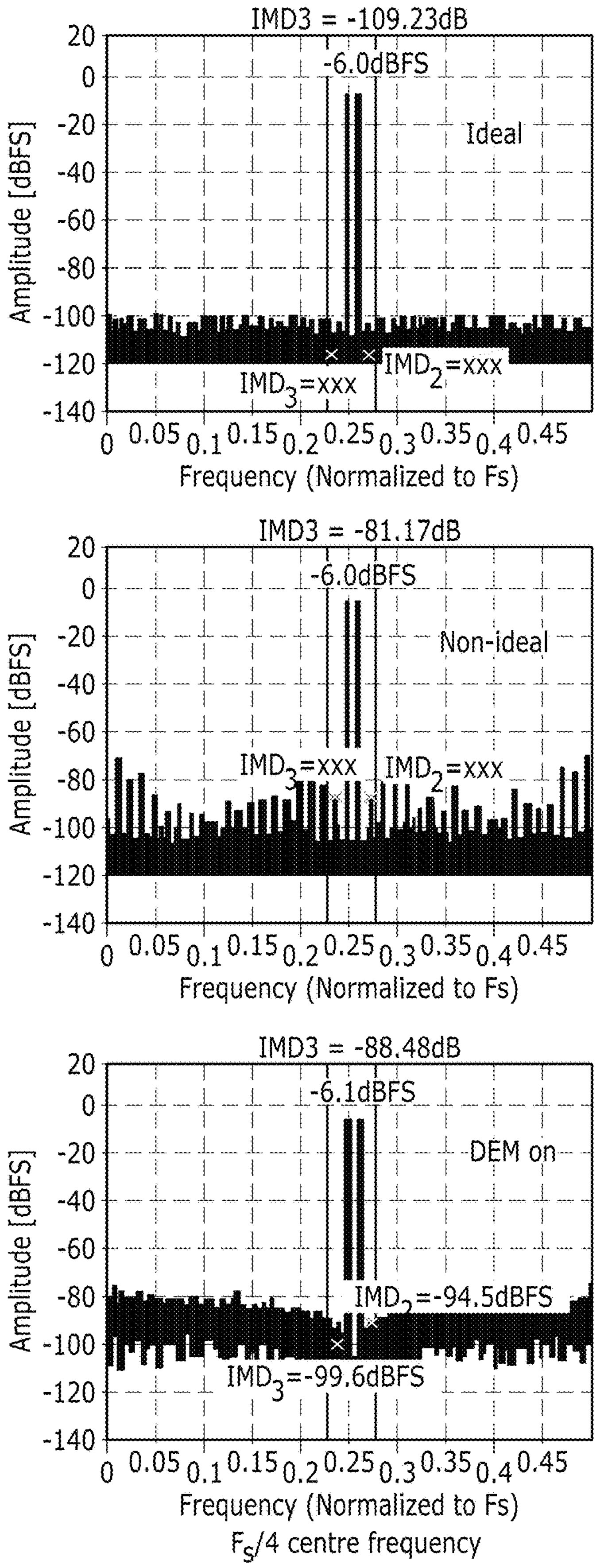
FIG. 11B shows ideal, non-ideal and $2^{nd}$ order amplitude and timing error shaping DEM enabled two-tone spectrum plots showing IMD3 for a 12-bit Nyquist DAC at $F_s/4$ center frequency.
Figure 11C:
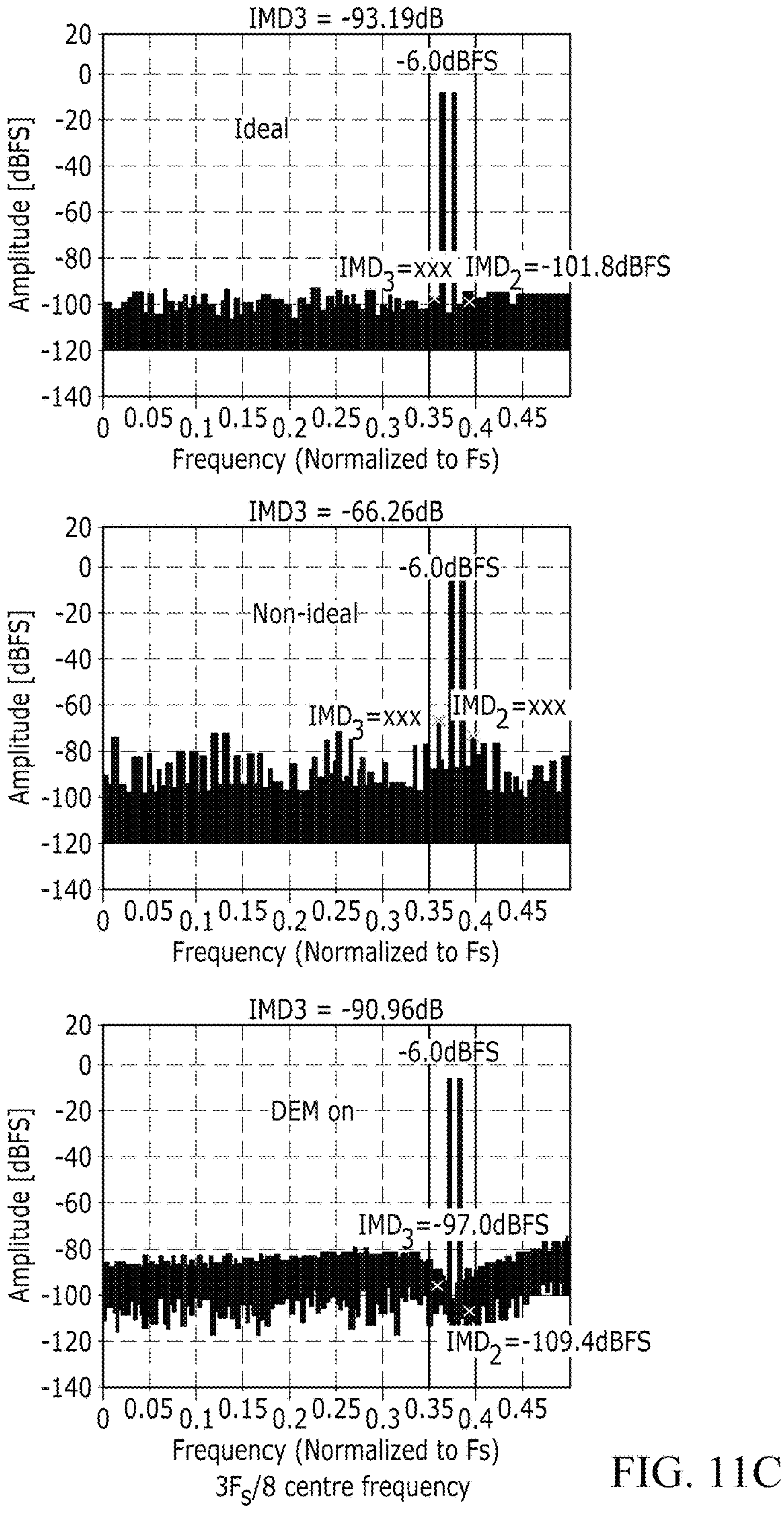
FIG. 11C shows ideal, non-ideal and $2^{nd}$ order amplitude and timing error shaping DEM enabled two-tone spectrum plots showing IMD3 for a 12-bit Nyquist DAC at $3F_s/8$ center frequency.

The DEM on/off single tone spectrum for a 12-bit Nyquist DAC at $F_s/8$, $F_s/4$, and $3F_s/8$ centre-frequencies is shown in FIGS. 10(*a*), (*b*) and (*c*) respectively. FIGS. 11(*a*), (*b*) and (*c*) shows DEM on/off dual-tone IMD3 spectrum for a 12-bit Nyquist DAC at $F_s/8$, $F_s/4$, and $3F_s/8$ centre frequencies. Here the two tones are placed ±5% around these centre frequencies. To obtain these results, an input-tone is chosen close to $F_s/8$, $F_s/4$, and $3F_s/8$ centre frequencies. In this scenario, the maximum number of ON transitions for an input tone close to $F_s/8$ is 14; therefore, the constant number of ON transitions i.e. $T_n$ is set to 14. Similarly, the constant number of ON transitions i.e. $T_n$ for the chosen input tones close to $F_s/4$ and $3F_s/8$ centre frequency is set to 23 and 30 respectively.

For the simulation results, a 0.5% Gaussian distributed mismatch error, a 0.3% Gaussian distributed timing-skew error, and a 0.1% absolute common-duty-cycle error on the DAC elements is used. The performance is evaluated over 5% of the $F_s$ around the centre frequencies.

FIGS. 10A-10C and FIGS. 11A-11C show that the distortion tones around −50 dB and the −60 dB levels are suppressed to ~−80 dB for the DEM enabled case. This shows the capability of the presented DEM system in suppressing the in band as well as the out of band distortion tones over the first Nyquist band.

The min, max and average SNDR, SFDR, IMD3 results for DEM on/off case using 100 MC runs at $F_s/8$, $F_s/4$, and $3F_s/8$ centre-frequencies are tabulated in Table 6. The Table shows that the SFDR and IMD3 performance of the DAC improves ~12 dB and ~10 dB respectively over a narrow bandwidth for the DEM enabled case.

TABLE 6

$2^{nd}$ order DEM on/off min, max and average SNDR, SFDR and IMD3 results for a 12-bit Nyquist DAC at $F_s/8$, $F_s/4$ and $3F_s/8$ centre-frequencies using 100 MC runs.

| | Ideal | DEM off | | | DEM on | | |
|---|---|---|---|---|---|---|---|
| | Avg. | Min. | Max. | Avg. | Min. | Max. | Avg. |
| At $F_s/8$ centre-frequency | | | | | | | |
| SNDR (dB) | 84.5 | 70.74 | 76.30 | 74.22 | 68.97 | 71.88 | 70.79 |
| SFDR (dB) | 96 | 71.91 | 84.32 | 78.33 | 83.19 | 88.88 | 86.76 |
| IMD3 (dB) | 96 | 66.65 | 81.43 | 77.32 | 85.30 | 90.99 | 87.56 |
| At $F_s/4$ centre-frequency | | | | | | | |
| SNDR (dB) | 84.5 | 64.53 | 71.86 | 68.13 | 67.98 | 73.33 | 71.49 |
| SFDR (dB) | 96 | 65.46 | 77.38 | 71.87 | 83.54 | 91.42 | 87.91 |
| IMD3 (dB) | 96 | 64.84 | 80.99 | 73.47 | 85.43 | 94.83 | 89.64 |
| At 3 $F_s/8$ centre-frequency | | | | | | | |
| SNDR (dB) | 84.5 | 68.06 | 77.00 | 74.00 | 69.10 | 72.12 | 70.11 |
| SFDR (dB) | 96 | 68.44 | 84.65 | 77.30 | 84.17 | 88.38 | 85.48 |
| IMD3 (dB) | 96 | 66.74 | 83.28 | 74.64 | 82.79 | 96.19 | 87.60 |

Figure 12A:
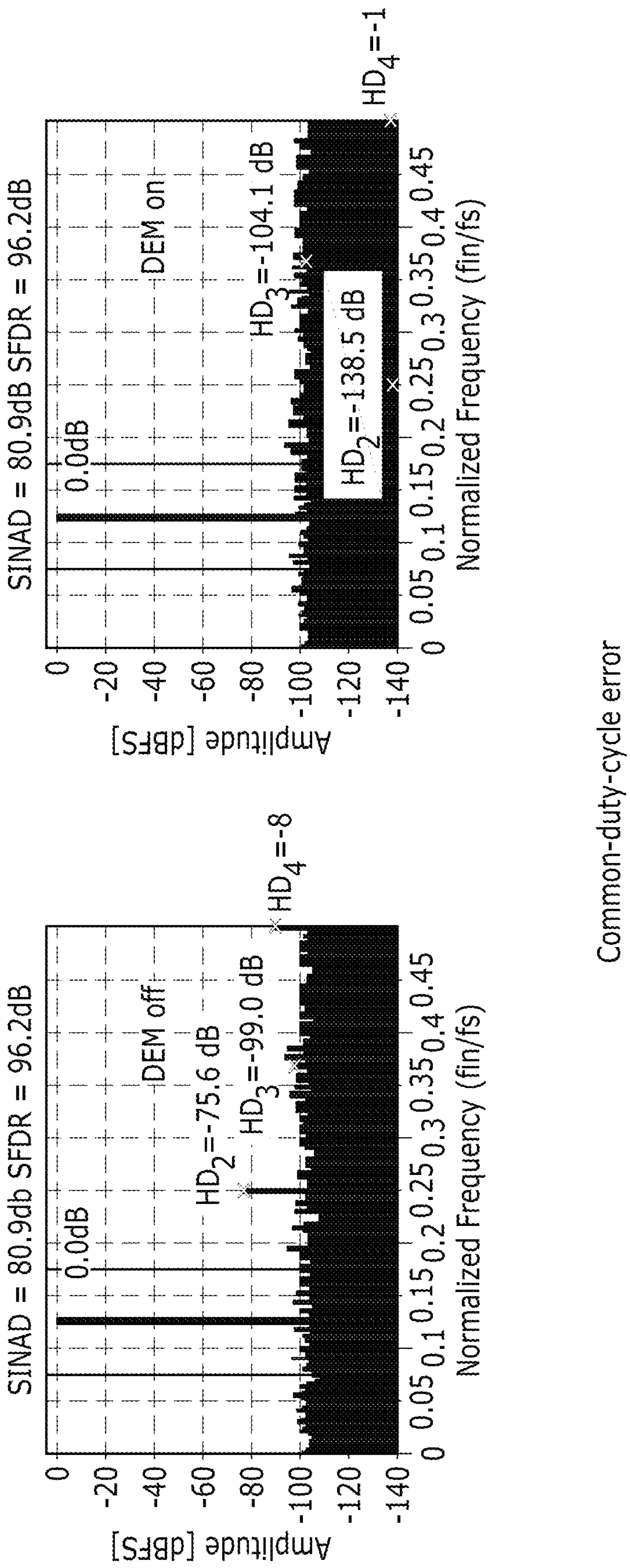
Figure 12B:
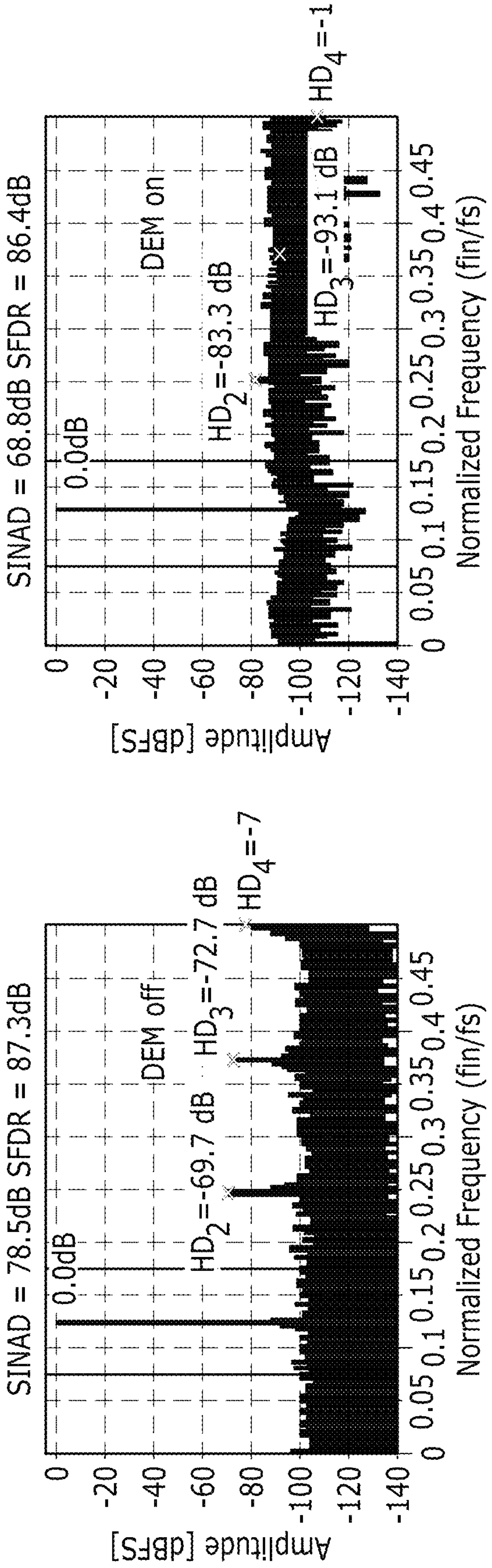
Figure 12C:
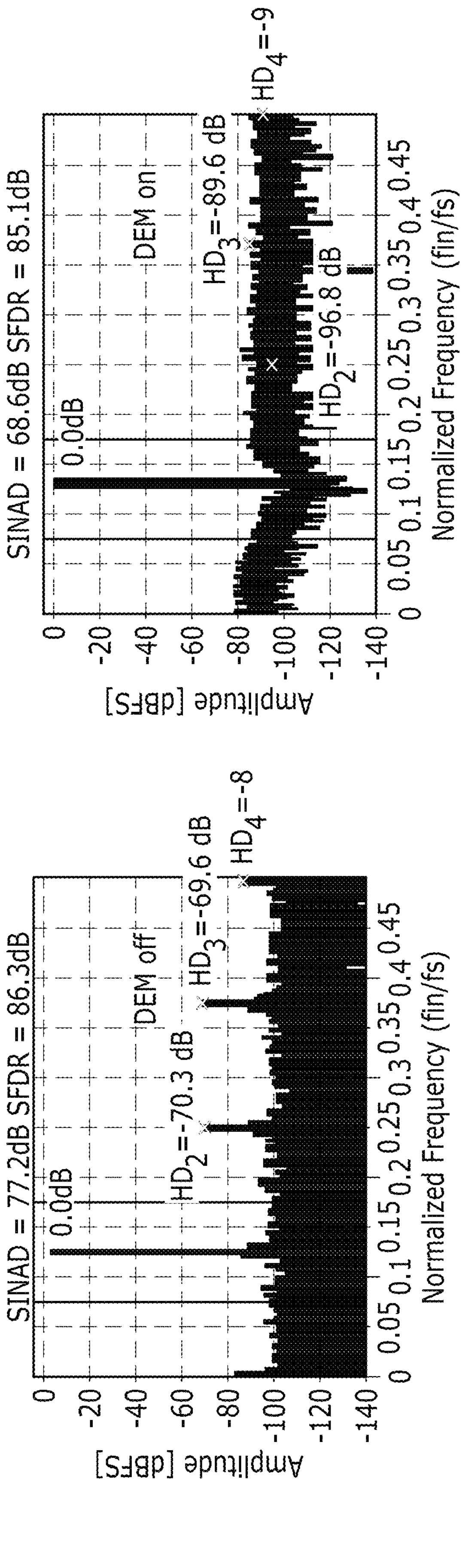

An individual spectrum of the common-duty-cycle error ($D_{com}$=0.1%), random timing-skew error ($\sigma_{timing}$=0.3%), and random mismatch error ($\sigma_{mismatch}$=0.5%) is shown in FIGS. 12A, 12B, and 12C, respectively at $F_s/8$ centre-frequency. It can be seen from the figure that the random mismatch error and random timing-skew error is shaped around $F_s/8$ centre-frequency for the DEM enabled case. The common-duty-cycle error is seen to be eliminated from the spectrum using the DEM on solution.

Figure 13:
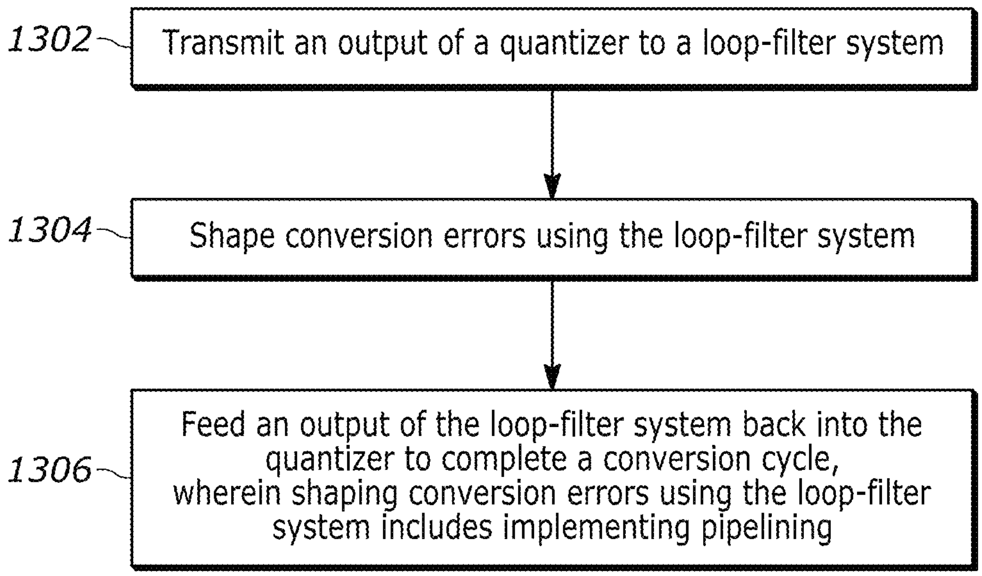
FIG. 13 depicts an example of a method for performing DEM in a digital-to-analog conversion system

FIG. 13 depicts an example of a method for performing DEM in a digital-to-analog conversion system. At block 1302, an output of a quantizer is transmitted to a loop-filter system. At block 1304, conversion errors are shaped using the loop-filter system. At block 1306, an output of the loop-filter system is fed back into the quantizer to complete a conversion cycle, wherein shaping conversion errors using the loop-filter system includes implementing pipelining. In some examples, the method described with reference to FIG. 13 can be implemented in the circuits and/or systems described herein.

In the specification, the terms "comprise," "comprises," "comprised," and "comprising," as well as any variations thereof, and the terms "include," "includes," "included," and "including," as well as any variations thereof, are intended to be used interchangeably and should be construed to have the broadest possible interpretation. These terms are not to be construed as limiting, and their usage is intended to encompass all forms and variations.

The invention is not intended to be limited to the embodiments specifically described herein, and it is understood that modifications, alterations, and variations may be made to the invention in both its construction and detail, all of which are within the scope of the invention as defined by the appended claims.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program.

The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A dynamic element matching (DEM) system for a Nyquist-rate digital-to-analog converter (DAC), comprising:

multiple digital encoders, each digital encoder including;

a loop-filter system, where the loop-filter system includes delay elements, adders, and at least one multiplier configured to implement pipelining; and a feedback loop that couples an output of a quantizer to an input of the filter system and couples an output of the filter system to an input of the quantizer;

wherein the loop-filter system further includes at least one multiplexer that is configured with pre-computed values to replace a multiplication operation, and that is controlled in response to the output from the quantizer.

2. The DEM system of claim 1, wherein the at least one multiplexer includes three multiplexers that are configured with pre-computed values to replace multiplication operations, and that are controlled in response to the output from the quantizer.

3. The DEM system of claim 1, wherein the at least one multiplexer includes three multiplexers configured with pre-computed values to replace multiplication operations and to receive the output of the quantizer, a first multiplexer of the three multiplexers configured to receive 0, $b_0$, and $-b_0$ as inputs, a second multiplexer of the three multiplexers configured to receive 0, $b_1$, and $-b_1$ as inputs, and a third multiplexer of the three multiplexers configured to receive 0, +1, and −1 as inputs.

4. The DEM system of claim 1, wherein $a_0$ is applied to a first multiplier, $b_0$ is applied to a second multiplier, and $b_1$ is applied to a third multiplier.

5. The DEM system of claim 1, wherein $a_0$ is applied to the at least one multiplier, wherein $b_0$ is applied to a first multiplexer, and $b_1$ is applied to a second multiplexer, and 0, 1, +1 is applied to a third multiplexer.

6. The DEM system of claim 1, wherein $a_0$ is applied to the at least one multiplier, and further including a bank of multiplexers configured to receive the output of the quantizer, a first multiplexer configured to receive 0, $b_0$, and $-b_0$ as inputs, a second multiplexer configured to receive 0, $b_1$, and $-b_1$ as inputs, and a third multiplexer configured to receive 0, +1, and −1 as inputs.

7. The DEM system of claim 1, wherein the DEM system is a tree-structured DEM (TS DEM) that includes a tree structure of switching blocks, wherein each switching block includes an encoder and a quantizer.

8. The DEM of claim 1, wherein the loop-filter system is configured for dynamic adjustment of its order.

9. The DEM system of claim 1, wherein the DEM system is configured to accept a full-scale signal as the input.

10. The DEM system of claim 1, wherein the loop-filter system includes a mismatch loop filter configured to shape mismatch errors introduced by the DAC.

11. The DEM system of claim 1, wherein the loop-filter system includes a timing loop filter configured to shape timing errors introduced by the DAC.

12. The DEM system of claim 1, wherein the loop-filter system includes:

a mismatch loop filter configured to shape mismatch errors introduced by the DAC; and a timing loop filter configured to shape timing errors introduced by the DAC.

13. The DEM system of claim 1, wherein the loop-filter system includes one of a notch filter and a band-pass filter.

14. The DEM system of claim 1, wherein the loop-filter system includes one of an infinite impulse response (IIR) filter and a finite impulse response (FIR) filter.

15. The DEM system of claim 1, wherein the loop-filter system is implemented through multiple digital biquad filters.

16. The DEM system of claim 1, wherein the DEM system is a vector-feedback DEM (VF DEM) system.

17. A tree-structured dynamic element matching (TS DEM) system for a Nyquist-rate digital-to-analog converter (DAC), comprising:
- multiple TS DEM switching blocks, each TS DEM switching block including digital encoders, each digital encoder including;
  - a quantizer;
  - a loop-filter system, where the loop-filter system includes a mismatch loop filter configured to shape mismatch errors introduced by the DAC, where the loop-filter system includes delay elements, adders, and at least one multiplier configured to implement pipelining; and
  - a feedback loop that couples an output of the quantizer to an input of the loop-filter system and couples an output of the loop-filter system to an input of the quantizer.

18. The DEM system of claim 17, wherein the loop-filter system further includes at least one multiplexer that is configured with pre-computed values to replace a multiplication operation, and that is controlled in response to the output from the quantizer.

19. A method for performing dynamic element matching (DEM) in a digital-to-analog conversion system, the method comprising:
- transmitting an output of a quantizer to a loop-filter system;
- shaping conversion errors using the loop-filter system; and
- feeding an output of the loop-filter system back into the quantizer to complete a conversion cycle,
- wherein shaping conversion errors using the loop-filter system includes implementing pipelining;
- wherein the loop-filter system includes delay elements, adders, and at least one multiplier; and
- wherein the loop-filter system further includes at least one multiplexer that is configured with pre-computed values to implement a multiplication operation, and that is controlled in response to the output from the quantizer.

20. A dynamic element matching (DEM) system for a Nyquist-rate digital-to-analog converter (DAC), comprising:
- multiple digital encoders, each digital encoder including;
  - a loop-filter system, where the loop-filter system includes delay elements, adders, and at least one multiplier configured to implement pipelining; and
  - a feedback loop that couples an output of a quantizer to an input of the filter system and couples an output of the filter system to an input of the quantizer;
  - wherein $a_0$ is applied to a first multiplier, $b_0$ is applied to a second multiplier, and $b_1$ is applied to a third multiplier.

21. A dynamic element matching (DEM) system for a Nyquist-rate digital-to-analog converter (DAC), comprising:
- multiple digital encoders, each digital encoder including;
  - a loop-filter system, where the loop-filter system includes delay elements, adders, and at least one multiplier configured to implement pipelining; and
  - a feedback loop that couples an output of a quantizer to an input of the filter system and couples an output of the filter system to an input of the quantizer;
  - wherein $a_0$ is applied to the at least one multiplier, wherein $b_0$ is applied to a first multiplexer, and $b_1$ is applied to a second multiplexer, and 0, 1, +1 is applied to a third multiplexer.

22. A dynamic element matching (DEM) system for a Nyquist-rate digital-to-analog converter (DAC), comprising:
- multiple digital encoders, each digital encoder including;
  - a loop-filter system, where the loop-filter system includes delay elements, adders, and at least one multiplier configured to implement pipelining; and
  - a feedback loop that couples an output of a quantizer to an input of the filter system and couples an output of the filter system to an input of the quantizer;
  - wherein $a_0$ is applied to the at least one multiplier, and further including a bank of multiplexers configured to receive the output of the quantizer, a first multiplexer configured to receive 0, $b_0$, and $-b_0$ as inputs, a second multiplexer configured to receive 0, $b_1$, and $-b_1$ as inputs, and a third multiplexer configured to receive 0, +1, and −1 as inputs.

23. A dynamic element matching (DEM) system for a Nyquist-rate digital-to-analog converter (DAC), comprising:
- multiple digital encoders, each digital encoder including;
  - a loop-filter system, where the loop-filter system includes delay elements, adders, and at least one multiplier configured to implement pipelining; and
  - a feedback loop that couples an output of a quantizer to an input of the filter system and couples an output of the filter system to an input of the quantizer;
  - wherein the DEM system is a tree-structured DEM (TS DEM) that includes a tree structure of switching blocks, wherein each switching block includes an encoder and a quantizer.

* * * * *